US006962829B2

(12) United States Patent
Glenn et al.

(10) Patent No.: US 6,962,829 B2
(45) Date of Patent: *Nov. 8, 2005

(54) METHOD OF MAKING NEAR CHIP SIZE INTEGRATED CIRCUIT PACKAGE

(75) Inventors: Thomas P. Glenn, Gilbert, AZ (US); Roy D. Hollaway, Paranague (PH); Anthony E. Panczak, Sunnyvale, CA (US)

(73) Assignee: Amkor Technology, Inc., Chandler, AZ (US)

( * ) Notice: Subject to any disclaimer, the term of this patent is extended or adjusted under 35 U.S.C. 154(b) by 11 days.

This patent is subject to a terminal disclaimer.

(21) Appl. No.: 10/150,400

(22) Filed: May 17, 2002

(65) Prior Publication Data

US 2002/0168798 A1 Nov. 14, 2002

Related U.S. Application Data

(60) Division of application No. 09/585,901, filed on Jun. 2, 2000, now abandoned, which is a division of application No. 09/083,524, filed on May 22, 1998, now Pat. No. 6,150,193, which is a continuation-in-part of application No. 08/741,797, filed on Oct. 31, 1996, now Pat. No. 5,981,314.

(51) Int. Cl.⁷ .......................... H01L 21/00; H05K 3/30
(52) U.S. Cl. .................. 438/33; 438/114; 438/458; 438/464; 29/835
(58) Field of Search ............................... 438/33, 68, 113, 438/114, 458, 459, 462, 464, 107–110, 125–127; 29/832, 835, 841

(56) References Cited

U.S. PATENT DOCUMENTS

| 4,138,304 | A | 2/1979 | Gantley ....................... 156/268 |
| 4,508,758 | A | 4/1985 | Wong .......................... 427/96 |
| 4,530,152 | A | 7/1985 | Roche et al. ................. 29/588 |
| 4,768,081 | A | 8/1988 | Moeller ........................ 357/72 |
| 4,890,383 | A | 1/1990 | Lumbard et al. .............. 29/841 |
| 5,081,520 | A | 1/1992 | Yoshii et al. .................. 357/80 |
| 5,087,961 | A | 2/1992 | Long et al. .................... 357/69 |
| 5,102,829 | A | 4/1992 | Cohn .......................... 437/217 |
| 5,126,818 | A | 6/1992 | Takami et al. ................. 357/68 |
| 5,153,379 | A | 10/1992 | Guzuk et al. .............. 174/35 R |
| 5,173,766 | A | 12/1992 | Long et al. .................. 257/687 |
| 5,216,278 | A | 6/1993 | Lin et al. .................... 257/688 |
| 5,227,663 | A | 7/1993 | Patil et al. ................... 257/718 |
| 5,239,198 | A | 8/1993 | Lin et al. .................... 257/693 |
| 5,241,133 | A | 8/1993 | Mullen, III et al. ....... 174/52.4 |

(Continued)

FOREIGN PATENT DOCUMENTS

| JP | 55-11361 | 1/1980 |
| JP | 58-48442 | 3/1983 |

(Continued)

OTHER PUBLICATIONS

Banerji, K., "Development of the Slightly Larger than IC Carrier (SLICC)", Proceedings of the Feb. 27–Mar. 4, 1994, Technical Program Nepcon West '94, pp. 1249–1256.

(Continued)

Primary Examiner—Alonzo Chambliss
(74) Attorney, Agent, or Firm—Gunnison, McKay & Hodgson, L.L.P.; Serge J. Hodgson

(57) ABSTRACT

A plurality of integrated circuit chip (IC chip) packages are fabricated simultaneously from a single insulating substrate having sections. In each section, an IC chip is attached. Bonding pads on the IC chip are electrically connected to first metallizations on a substrate first surface. The first metallizations, IC chip including bonding pads and first substrate surface are then encapsulated. Interconnection balls or pads are formed at substrate bonding locations on a substrate second surface, the interconnection pads or balls being electrically connected to corresponding first metallizations. The substrate and encapsulant are then cut along the periphery of each section to form the plurality of IC chip packages.

19 Claims, 20 Drawing Sheets

U.S. PATENT DOCUMENTS

| | | | |
|---|---|---|---|
| 5,250,470 A | 10/1993 | Yamaguchi | 437/211 |
| 5,258,650 A | 11/1993 | Polak et al. | 257/788 |
| 5,311,059 A | 5/1994 | Banerji et al. | 257/778 |
| 5,311,060 A | 5/1994 | Rostoker et al. | 257/796 |
| 5,336,931 A | 8/1994 | Juskey et al. | 257/787 |
| 5,371,404 A | 12/1994 | Juskey et al. | 257/659 |
| 5,386,342 A | 1/1995 | Rostoker | 361/749 |
| 5,397,746 A | 3/1995 | Blish, II | 437/209 |
| 5,436,203 A | 7/1995 | Lin | 437/209 |
| 5,468,999 A | 11/1995 | Lin et al. | 257/784 |
| 5,472,646 A | 12/1995 | Uchida et al. | 264/1.7 |
| 5,473,512 A | 12/1995 | Degani et al. | 361/760 |
| 5,474,957 A | 12/1995 | Urushima | 437/209 |
| 5,489,059 A | 2/1996 | Rostoker et al. | 228/175 |
| 5,578,525 A | 11/1996 | Mizukoshi | 437/206 |
| 5,593,926 A | 1/1997 | Fujihara | 437/209 |
| 5,596,485 A | 1/1997 | Glenn et al. | 361/703 |
| 5,600,181 A | 2/1997 | Scott et al. | 257/723 |
| 5,612,513 A | 3/1997 | Tuttle et al. | 174/260 |
| 5,639,989 A | 6/1997 | Higgins, III | 174/35 MS |
| 5,668,406 A | 9/1997 | Egawa | 257/690 |
| 5,700,981 A | 12/1997 | Tuttle et al. | 174/250 |
| 5,719,440 A | 2/1998 | Moden | 257/697 |
| 5,729,437 A | 3/1998 | Hashimoto | 361/760 |
| 5,737,191 A * | 4/1998 | Horiuchi et al. | 361/764 |
| 5,767,447 A | 6/1998 | Dudderar et al. | 174/52.4 |
| 5,776,798 A | 7/1998 | Quan et al. | 438/112 |
| 5,835,141 A | 11/1998 | Ackland et al. | 348/308 |
| 5,841,192 A | 11/1998 | Exposito | 257/701 |
| 5,864,132 A | 1/1999 | Holcombe | 250/208.1 |
| 5,872,338 A | 2/1999 | Lan et al. | 174/255 |
| 5,901,257 A | 5/1999 | Chen et al. | 382/312 |
| 5,949,132 A | 9/1999 | Libres et al. | 257/666 |
| 5,973,263 A | 10/1999 | Tuttle et al. | 23/28 |
| 5,973,337 A | 10/1999 | Knapp et al. | 257/99 |
| 5,976,912 A | 11/1999 | Fukutomi et al. | 438/110 |
| 5,981,314 A | 11/1999 | Glenn et al. | 438/127 |
| 5,990,545 A | 11/1999 | Schueller et al. | 257/697 |
| 6,092,281 A | 7/2000 | Glenn | 29/841 |
| 6,111,324 A * | 8/2000 | Sheppard et al. | 257/787 |
| 6,150,193 A | 11/2000 | Glenn | |
| 6,228,676 B1 | 5/2001 | Glenn et al. | 438/107 |

FOREIGN PATENT DOCUMENTS

| | | |
|---|---|---|
| JP | 62-9639 | 1/1987 |
| JP | 05218230 | 8/1993 |
| JP | 06 326218 | 11/1994 |
| JP | WO95/26047 | 9/1995 |
| JP | 10242442 | 9/1998 |
| JP | 11067959 | 3/1999 |
| WO | WO99/13515 | 3/1999 |
| WO | WO99/40624 | 8/1999 |

OTHER PUBLICATIONS

Levine, B. and Guinther, F., "The Package", *Electronic News* vol. 42, No. 2112 (1996), pp. 1,32.

Shweky, I. et al., "A CSP Optoelectronic Package for Imaging and Light Detection Applications," Part of the IS&T/SPIE Conference on Sensors, Cameras, and Applications for Digital Photography; San Jose, CA. Jan. 1999: SPIE vol. 3650, pp. 63–68.

Lu, Brian, et al., "Active Pixel Sensor (APS) Package," Ton Hsing Electronic Industries, Ltd.And Silicon Coast, Inc.. pp. 175–178.

* cited by examiner

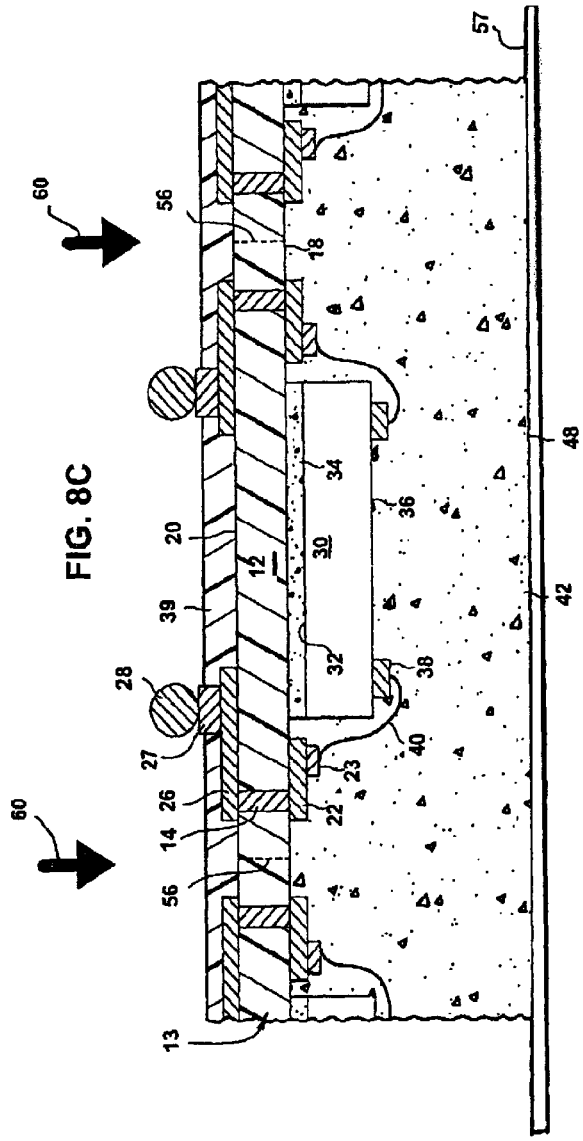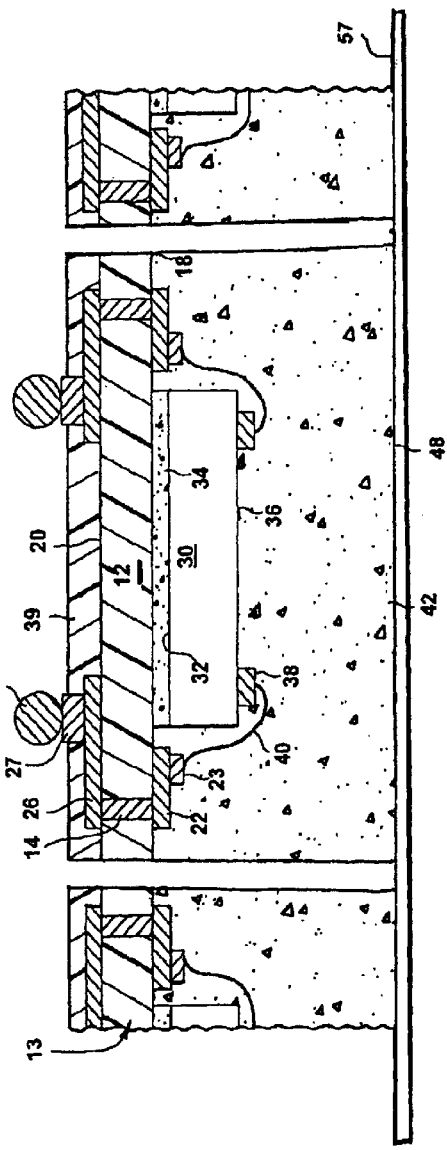

METHOD OF MAKING NEAR CHIP SIZE INTEGRATED CIRCUIT PACKAGE

CROSS-REFERENCE TO RELATED APPLICATIONS

This application is a division of U.S. patent application Ser. No. 09/585,901, filed Jun. 2, 2000, now abandoned, which is a division of U.S. patent application Ser. No. 09/083,524, filed May 22, 1998, now U.S. Pat. No. 6,150,193, which is continuation-in-part of U.S. patent application Ser. No. 08/741,797, filed Oct. 31, 1996, now U.S. Pat. 5,981,314, by Thomas P. Glenn et al., all of which applications are herein incorporated by reference in their respective entirety.

FIELD OF THE INVENTION

The present invention relates to the art of electronic packaging and more particularly to a method of packaging an integrated circuit chip and the resulting structure.

BACKGROUND OF THE INVENTION

As electronic devices become increasingly compact and lightweight, it becomes increasingly desirable to reduce the size of integrated circuit chip (IC chip) packages. In addition to reducing the size of IC chip packages, it is also desirable to simultaneously decrease the manufacturing cost of IC chip packages.

As the spacing between IC chip packages and other electronic components decreases, shielding becomes increasingly important. Shielding prevents radiation emanating from an IC chip package from interfering with adjacent electronic components and also prevents radiation emanating from the adjacent electronic components from interfering with the IC chip package (this type of radiation is typically referred to as crosstalk). Shielding is typically accomplished by covering the IC chip package and/or electronic components with a preformed piece of metal such as copper. However, metal shielding is relatively expensive and inhibits reduction in weight and size of electronic devices.

Higgins, U.S. Pat. No. 5,639,989 (hereinafter Higgins), herein incorporated by reference in its entirety, teaches a method of shielding an electronic component assembly. The method includes forming a conformal electrically insulating layer over a semiconductor device and over signal traces. An electrically conductive conformal shielding layer is then deposited over the insulating layer, wherein the electrically conductive shielding layer is a particulate-filled polymer.

As shown in Higgins FIG. 2, the conformal electrically insulating/conductive layers are formed after the semiconductor devices are attached to a larger substrate such as a printed circuit board. In this manner, crosstalk between adjacent semiconductor devices is prevented. However, applying the electrically insulating/conductive layers after the semiconductor devices are attached to the printed circuit board adds complexity to the manufacturing process and hinders reworking the assembly. Accordingly, it is desirable to incorporate shielding into the IC chip packaging itself thus avoiding the additional manufacturing step of shielding after the IC chip packages are assembled to the printed circuit board.

Lin, U.S. Pat. No. 5,436,203 (hereinafter Lin), herein incorporated by reference in its entirety, teaches a shielded IC chip package. Referring to Lin FIG. 15, to form the shielded IC chip package, a first dam structure 40 is formed and used to constrain the flow of an electrically insulating encapsulant 38. After IC chip 32 is encapsulated in electrically insulating encapsulant 38, a second dam structure 44 is formed and used to constrain the flow of an electrically conductive encapsulant 42.

Electrically conductive encapsulant 42 is electrically tied to an internal reference plane 22 by reference pads 18 and conductive vias 20. Thus, IC chip 32 is effectively shielded from both the top and bottom by the combination of electrically conductive encapsulant 42 and internal reference plane 22.

Although the shielded IC chip package of Lin is effective in shielding, the resulting package is relatively large and expensive to manufacture. In particular, a first amount of substrate area is necessary to form first dam structure 40, a second amount of substrate area is necessary to form second dam structure 44 and a third amount of substrate area between dam structure 40 and 44 is necessary to allow electrical interconnection between electrically conductive encapsulant 42 and reference pads 18. As a result, the shielded IC chip package of Lin is substantially larger than the package IC chip 32. Further, formation of two dam structure 40 and 44 is relatively complex, adding to the manufacturing cost of forming the shielded IC chip package. Accordingly, a need exists for a shielded IC chip package which is near chip size, lightweight and relatively inexpensive to manufacture.

SUMMARY OF THE INVENTION

In accordance with the present invention, a near chip size integrated circuit package, called a CHIPARRAY7™ package, is presented. In one embodiment, the package includes an IC chip having a first surface with bonding pads formed thereon. A second surface of the IC chip is mounted to a first surface of an insulating substrate. The first surface of the insulating substrate has first metallizations formed thereon. Each of the bonding pads is electrically connected to a corresponding one of the first metallizations. The IC chip, bonding pads, first metallizations, bond wires and the first surface of the insulating substrate are encapsulated in a layer of encapsulant. The layer of encapsulant has edges which are coincident with edges of the insulating substrate.

Interconnection balls can be formed at bonding locations on a second surface of the insulating substrate. Alternatively, instead of forming interconnection balls, interconnection pads can be formed at the bonding locations. Each of the interconnection balls or interconnection pads are electrically coupled to a corresponding one of the first metallizations.

A package formed in accordance with the present invention is near chip size (i.e. the distance between the edge of the insulating substrate and the IC chip can be as small as 10 mil). Thus, the package is particularly advantageous in applications where limited space for the IC chip package is available such as in disk drive applications.

In accordance with the present invention, a method for fabricating several IC chip packages from a single substrate is also presented. The method includes providing the insulating substrate which has sections with first metallizations formed on a first surface of the insulating substrate. An IC chip is mounted in each of the sections, the IC chips having first surfaces with bonding pads formed thereon. The bonding pads are electrically connected to corresponding ones of the first metallizations with bond wires. The bonding pads, the first surfaces of the IC chips, the first metallizations and the first surface of the insulating substrate are encapsulated in a layer of encapsulant. The layer of encapsulant and the insulating substrate are cut along a periphery of each of the sections to form the plurality of integrated circuit chip packages.

The method can further include forming interconnection balls, or alternatively, interconnection pads at substrate bonding locations on a second surface of the insulating substrate, the interconnection balls or pads being electrically connected to corresponding first metallizations. Fabricating a plurality of packages simultaneously (in contrast to individually) from a single substrate advantageously reduces handling cost and substrate waste thereby reducing the cost of fabricating each individual package.

In accordance with the present invention, a shielded package for an IC chip having bond pads thereon includes an insulating substrate having metallizations formed on a surface of the substrate. The IC chip is mounted to the substrate surface and the IC chip bonding pads are electrically coupled to corresponding substrate metallizations. An electrically insulating encapsulant layer encapsulates the IC chip and the substrate surface. An electrically conductive shield layer comprising a cured flowable electrically conductive material is formed above the encapsulant layer.

The encapsulant layer electrically isolates the shield layer from the IC chip and the various electrical conductors (e.g. bonding pads, bond wires, contacts and metallizations). The shield layer, being an electrically conductive material, forms a floating ground plane which shields the IC chip and the remainder of the package. Thus, the shield layer prevents external radiation form interfering with the operation of the package and also prevents the package from emitting radiation which could interfere with other electronic components and devices.

Forming the shield layer from a cured flowable electrically conductive material in contrast to a preformed metal sheet advantageously reduces the cost and weight of the package. Further, the problems associated with embedding a metal sheet into encapsulant (e.g. delamination and thermal cracking) are avoided.

Also in accordance with the present invention, a method of packaging a plurality of IC chips includes the step of providing an insulating substrate having sections. The IC chips are mounted in the sections and then encapsulated in an insulating encapsulant layer. A conductive shield layer is then applied above the encapsulant layer, the shield layer comprising a flowable electrically conductive material. The encapsulant layer, shield layer and insulating substrate are then cut along a periphery of each of the sections to form a plurality of shielded packages.

Fabricating a plurality of shielded packages simultaneously, in contrast to individually, from a single substrate advantageously reduces handling costs thereby reducing the cost of fabricating each individual package. Further, by fabricating a plurality of packages simultaneously from a single substrate, waste or trimming of the substrate is reduced or essentially eliminated thereby further reducing the cost of fabricating each individual package. (In contrast, when integrated circuit packages are fabricated individually, the substrate is slightly oversized to allow handling of the substrate, and the excess substrate is trimmed in subsequent fabrication steps.)

In another embodiment, a fully shielded package for an IC chip includes an insulated substrate having an internal ground plane, the IC chip being mounted on the insulating substrate. The package further includes an electrically insulating cap which encloses the IC chip and a first portion of the insulating substrate, and an electrically conductive shield layer which encloses the cap and a second portion of the insulating substrate. Ground contacts located on the second portion of the insulating substrate are electrically coupled to the internal ground plane and also to the shield layer. In this manner, the IC chip is fully shielded from the top and sides by the shield layer and from below by the ground plane.

To form a plurality of the fully shielded packages, an insulating substrate having sections and an internal ground plane is provided. Each of the sections of the insulating substrate includes a first portion and a second portion, the IC chips being mounted in the first portions. The IC chips and first portions are then enclosed in an electrically insulating cap. The caps and second portions of the insulating substrate are then enclosed in an electrically conductive shield layer. Ground contacts on the second portions of the insulating substrate and electrically conductive through-holes electrically couple the shield layer to the internal ground plane. The shield layer and insulating substrate are then cut along a periphery of each of the sections to form the individual fully shield packages.

These and other objects, features and advantages of the present invention will be more readily apparent from the detailed description of the preferred embodiments set forth below taken in conjunction with the accompanying drawings.

BRIEF DESCRIPTION OF THE DRAWINGS

FIGS. 8C and 8D are cross-sectional views of a package further along in fabrication in accordance with the present invention.

DESCRIPTION OF THE PREFERRED EMBODIMENTS

In accordance with the present invention, a near chip size integrated circuit package, called a CHIPARRAY™ package, is presented.

Several elements shown in the following figures are substantially similar. Therefore, similar reference numbers are used to represent similar elements.

Figure 1:
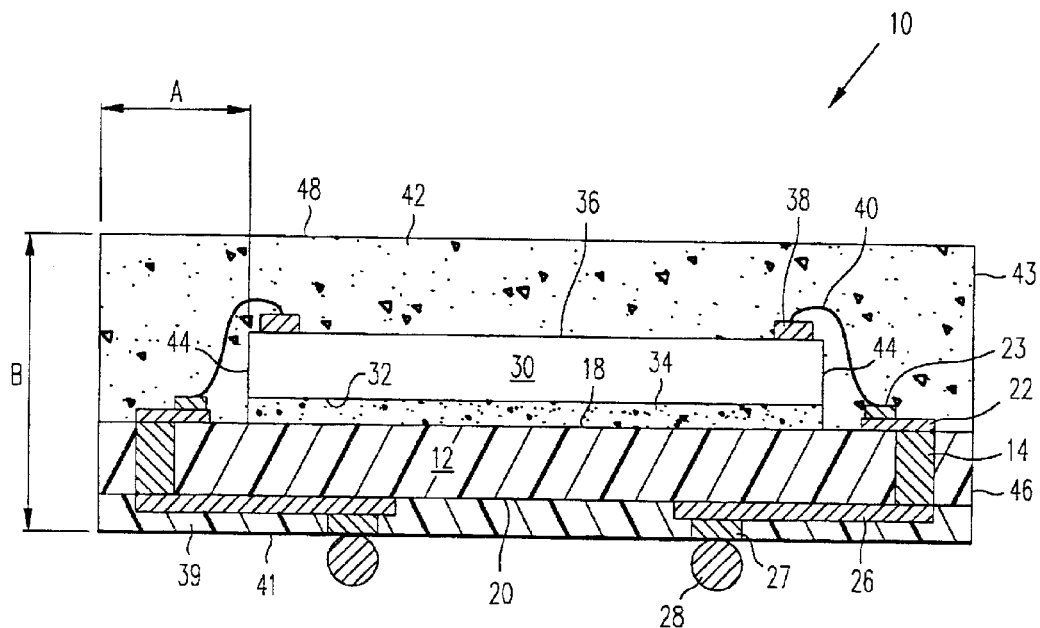
FIG. 1 is a cross-sectional view of a package in accordance with one embodiment of the present invention.

FIG. 1 is a cross-sectional view of a package 10 in accordance with one embodiment of the present invention. Package 10 includes an insulating substrate 12 having electrically conductive through-holes 14.

For example, by drilling holes in substrate 12 and then plating the drilled holes with a conductive material such as copper, conductive through-holes 14 are formed. Illustratively, copper is plated to a minimum thickness of 600 micro inches ($\mu$ in).

Substrate 12 is typically a ceramic, a laminate, a passivated metal or a printed circuit board substrate material. Examples of suitable ceramic substrates include 98% alumina or 98% aluminum nitride ceramic substrates available from Sumitomo, Kyocera, NTK and Coors. Examples of suitable laminate substrates include BT (Mitsubishi), FR-4, FR-5, Arlon and GTEK (Matsushita Electric) Laminate Substrates: An example of a suitable passivated metal substrate includes an anodized aluminum substrate available from Alcoa.

Conductive through-holes 14 extend from a first surface 18 to a second surface 20 of substrate 12. Formed on first surface 18 are electrically conductive traces or metallizations 22, typically formed of copper, each of which is electrically connected on a first end to a corresponding conductive through-hole 14. A contact 23 is formed on each metallization 22. Contact 23 is preferably a layer of gold or a multi-layer-metallization with a gold outer layer. In one embodiment, contact 23 is a nickel layer and overlying gold layer with minimum thicknesses of 200$\mu$ in and 20$\mu$ in, respectively.

Formed on second surface 20 are electrically conductive traces or metallizations 26, typically formed of copper, each electrically connected on a first end to a corresponding conductive through-hole 14. Formed on a second end of each metallization 26 is a contact 27 which is similar to contact 23.

Metallizations 22, 26 can be formed, for example, by masking and etching conductive layers formed on first and second surfaces 18, 20 of substrate 12. Contacts 23, 27 are formed using conventional processes such as electroplating or electro-less plating.

Formed on contacts 27 are interconnection balls 28, each of which is electrically connected to a second end of a metallization 26 by a contact 27.

Interconnection balls 28 allow interconnection between package 10 and other electrical components (not shown). Interconnection balls 28 are typically arranged in an array thus forming a ball grid array. In an alternative embodiment, instead of forming interconnection balls 28, contacts 27 are used as interconnection pads. In this embodiment, the typical minimum spacing between adjacent interconnection pads (contacts 27) is 0.30 millimeter (mm) to 1.00 mm.

In other embodiments, the interconnection balls or interconnection pads are not arranged in array but are located near the perimeter of package 10, i.e. are located near edges 46 of substrate 12.

In FIG. 1, a specific electrically conductive pathway between interconnection ball 28 and metallization 22 comprising contact 27, metallization 26 and conductive through-hole 14 is illustrated. However, it is understood that other electrically conductive pathways between interconnection ball 28 (or an interconnection pad) can be formed. For example, substrate 12 can be a multilayer laminate substrate having a plurality of electrically conductive vias electrically connecting conductive traces formed on various layers as is well known to those skilled in the art. Thus, it is to be understood that the electrically conductive pathway formed by contact 27, metallization 26 and conductive through-hole 14 is simply illustrative and not limiting, and that other electrically conductive pathways can be formed between the interconnection balls or interconnection pads and the corresponding metallizations 22.

Mounted to first surface 18 of substrate 12 is an integrated circuit (IC) chip 30. In particular, a first surface 32 of IC chip 30 is mounted to first surface 18 of substrate 12 typically by a layer of epoxy adhesive 34. Formed on a second surface 36, opposite first surface 32, of IC chip 30 are bonding pads 38. Bonding pads 38 are electrically connected to the internal electronic components of IC chip 30. Each bonding pad 38 is electrically connected to a corresponding metallization 22 by a bond wire 40 which is bonded to contact 23. Thus, an electrically conductive pathway is formed from each interconnection ball 28 to the corresponding bonding pad 38.

Second surface 36 of IC chip 30, bonding pads 38, bond wires 40, the exposed first surface 18 of substrate 12, contacts 23 and metallizations 22 are encapsulated in a layer of encapsulant 42. As shown in FIG. 1, edges 43 of layer of encapsulant 42 are coincident with edges 46 of substrate 12. Formed over portions of second surface 20 and metallizations 26 is an electrically insulating solder mask 39 which does not cover contacts 27 or interconnection balls 28. Solder mask 39 is applied and patterned using conventional techniques.

Figure 2:
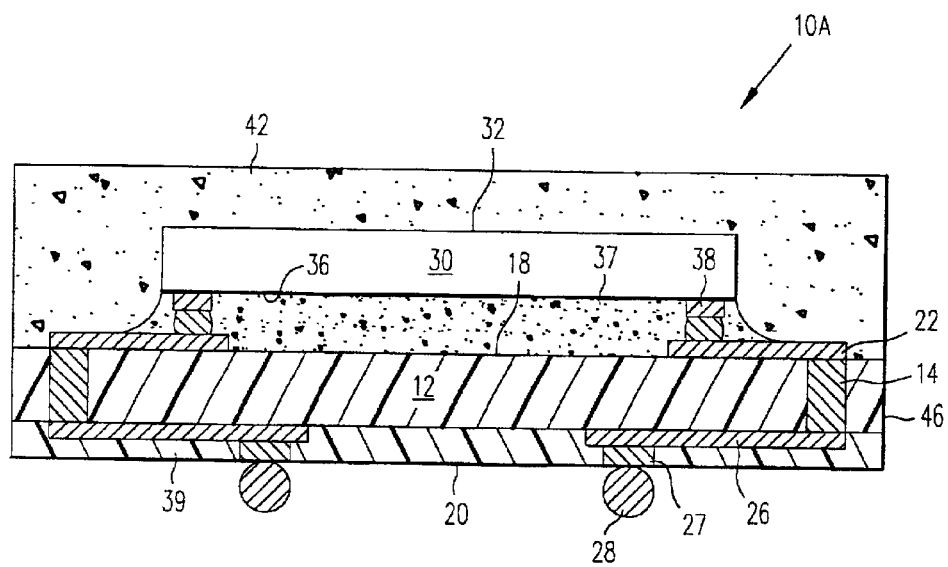
FIG. 2 is a cross-sectional view of a package in which a flip-chip interconnection is formed in accordance with an alternative embodiment of the present invention.

FIG. 2 is a cross-sectional view of a package 10A in which a flip-chip interconnection is formed in accordance with an alternative embodiment of the present invention. As shown in FIG. 2, IC chip 30 is mounted to substrate 12 using a flip-chip interconnection. More particularly, in this embodiment, second surface 36 of IC chip 30 is placed adjacent first surface 18 of substrate 12 and bonding pads 38 are electrically connected to metallizations 22 directly, for example by solder. (In FIG. 2, bonding pads 38 are bonded directly to metallizations 22 although, alternatively, bonding pads 38 can be bonded to contacts 23 (FIG. 1) on metallization 22.) Accordingly, bond wires 40 of FIG. 1 are unnecessary and therefore eliminated. An underfill material 37 is applied to fill the space between IC chip 30 and substrate 12 which also encapsulates the flip chip interconnection with bonding pads 38. In all other aspects, package 10A is substantially similar to package 10 in FIG. 1.

Referring back to FIG. 1, package 10 is a near chip size integrated circuit package, i.e. the distance A between any edge 44 of IC chip 30 and any edge 46 of substrate 12 can be as small as 10 mil (1 mil=1/1000 inch) and typically is between 40 to 60 mil and in one embodiment is 30 mil. Further, the distance B between an upper surface 48 of layer of encapsulant 42 and lower surface 41 of solder mask 39 is generally less than 60 mil and typically is between 40–60 mil and in particular depends in part upon the thickness of substrate 12, the thickness of IC chip 30 and the thickness of layer of encapsulant 42 over IC chip 30.

For example, substrate 12 has a thickness of 0.36 millimeter (mm) or 0.56 mm, IC chip 30 has a thickness of 0.010 in. to 0.013 in., preferably 0.011 in. and layer of encapsulant 42 over IC chip 30 has a thickness of 0.011 in. Since package 10 is near chip size, package 10 is particularly advantageous in applications where limited space for the IC-chip package is available such as in disk drive applications.

Figure 3A:
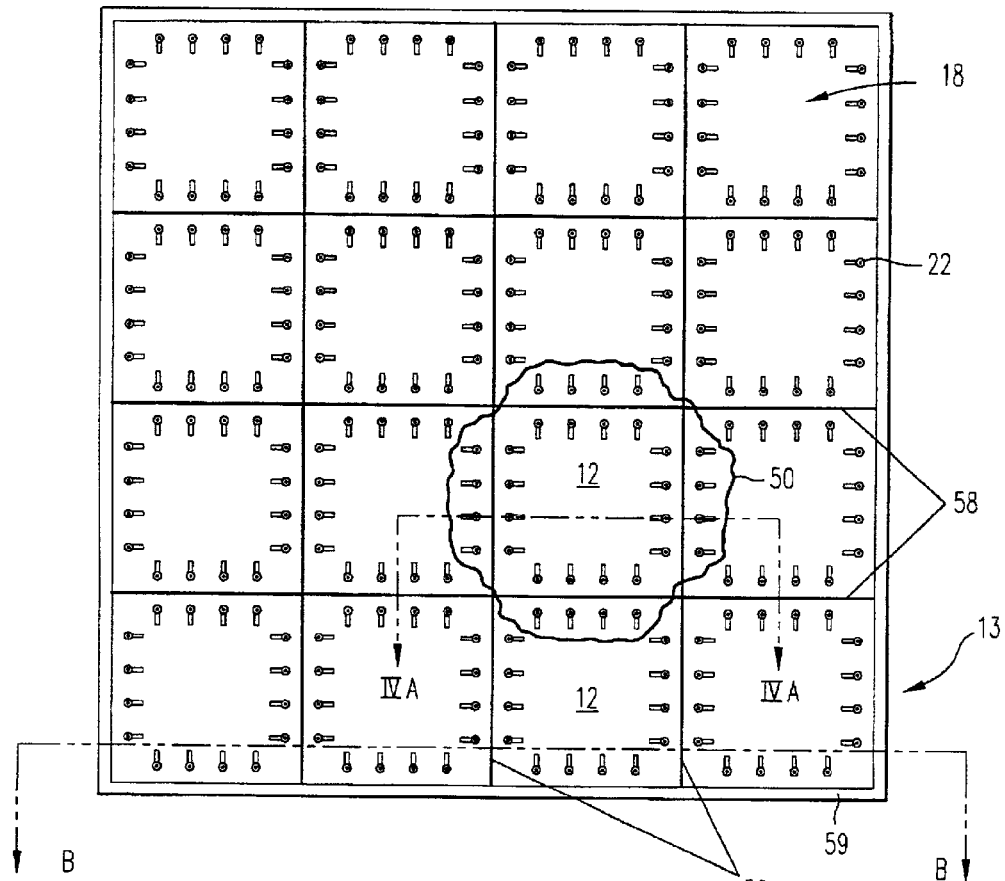
FIG. 3A is a top plan view of a substrate in accordance with the present invention.

FIG. 3A is an enlarged top plan view of a substrate 13 in accordance with the present invention. In FIG. 3A, a plurality of lines 56 oriented in the vertical direction, as well as a plurality of lines 58 oriented in the horizontal direction are illustrated. Lines 56 and 58 are included in the following figures to clarify the sections 12 where each individual package is to be formed, the formation of which is described in detail below. (For clarity, in FIG. 3A only two sections 12 are labeled). As shown in FIG. 3A, the periphery of each section 12 is defined by lines 56, 58. However, in an alternative embodiment, instead of lines 56, 58, alignment marks are provided for aligning substrate 13 in subsequent processing step such as those described below. Substrate 13 is preferably a square or rectangular substrate, for example is a 2.0 in.×2.0 in. (5.1 cm×5.1 cm), a 3.0 in.×3.0 in. (7.6 cm×7.6 cm) or a 4.0 in. ×4.0 in. (10.2 cm×10.2 cm) square substrate.

As shown in FIG. 3A, a dam 59 is formed on a first surface 18 of substrate 13 around the perimeter of substrate 13. Dam 59 encloses sections 12, yet does not extend into any of the section 12.

Figure 3B:
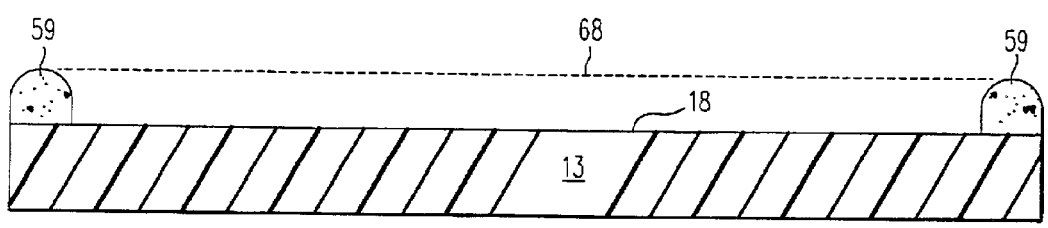
FIG. 3B is a cross-sectional view along the line B—B of FIG. 3A of the substrate.

FIG. 3B is a cross-sectional view along the line B—B of FIG. 3A of substrate 13. In FIG. 3B, metallizations, conductive through-holes and other features are not illustrated for clarity. As shown in FIG. 3B, dam 59 extends from first surface 18 to a predetermined height indicated by dashed line 68 above first surface 18 thereby defining a pocket which can be filled with encapsulant as described in more detail below.

Dam 59 can be any material suitable for preventing encapsulant from flowing off of substrate 13. In one embodiment, dam 59 is formed by applying encapsulant such as Dexter Hysol 4450 or 4451 or its equivalent. Referring back to FIG. 3A, each section 12 of substrate 13 has a plurality of metallizations 22 formed on first surface 18 of substrate 13, a plurality of contacts 23 (not shown) formed on metallizations 22 and a plurality of conductive through-holes 14 (not shown) formed through substrate 13. Metallizations 22 are formed using conventional techniques such as by forming a conductive layer on first surface 18 and then by masking and etching the conductive layer.

Conductive through-holes 14 are also formed using conventional techniques such as by drilling through-holes in substrate 13 and then plating the drilled through-holes with a conductive metal such as copper.

FIGS. 4 to 8 illustrate various stages in the formation of a package in accordance with the present invention. Although the formation of a single package is described for clarity, it should be understood that a plurality of packages are formed from a single substrate 13 simultaneously, one package being formed from each section 12 of substrate 13.

Figure 4A:
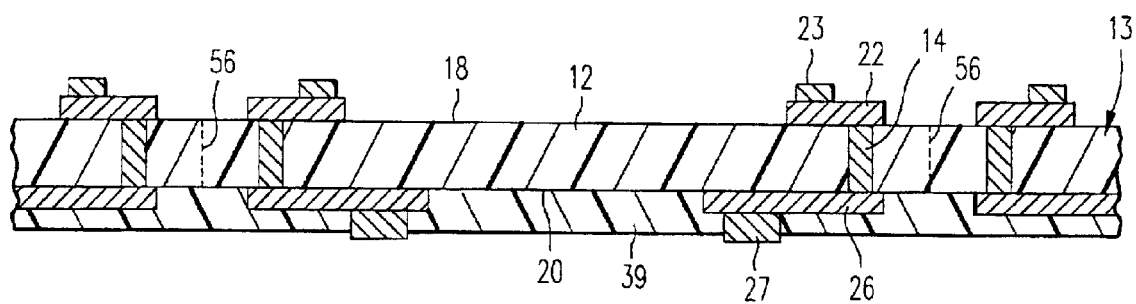
FIGS. 4A, 4B and 4C are cross-sectional (taken along the line A—A of FIG. 3A), top plan and bottom plan views, respectively, of a region of the substrate of FIG. 3A.

FIG. 4A is a cross-sectional view of substrate 13 and in particular of one of the sections 12 along the line A—A of FIG. 3A in accordance with one embodiment of the present invention. Contacts 23, metallizations 22, conductive through-holes 14, metallizations 26 and contacts 27 are illustrated in FIG. 4A. Also illustrated is solder mask 39.

Figure 4B:
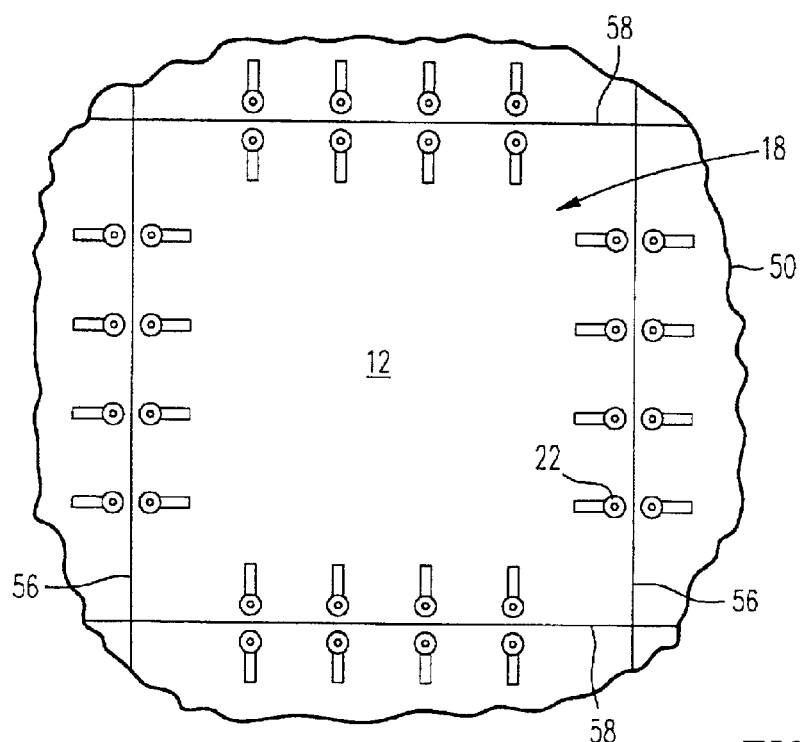

FIG. 4B is a top plan view of a region 50 of substrate 13 from FIG. 3A and in particular of one of the sections 12 illustrating metallizations 22 formed on first surface 18 of substrate 13. Contacts 23 are not illustrated in FIG. 4B for purposes of clarity. In one embodiment, metallizations 22 are a minimum of 0.017 in. long and a minimum of 0.005 in. wide although metallizations 22 with other dimensions can be used.

Figure 4C:
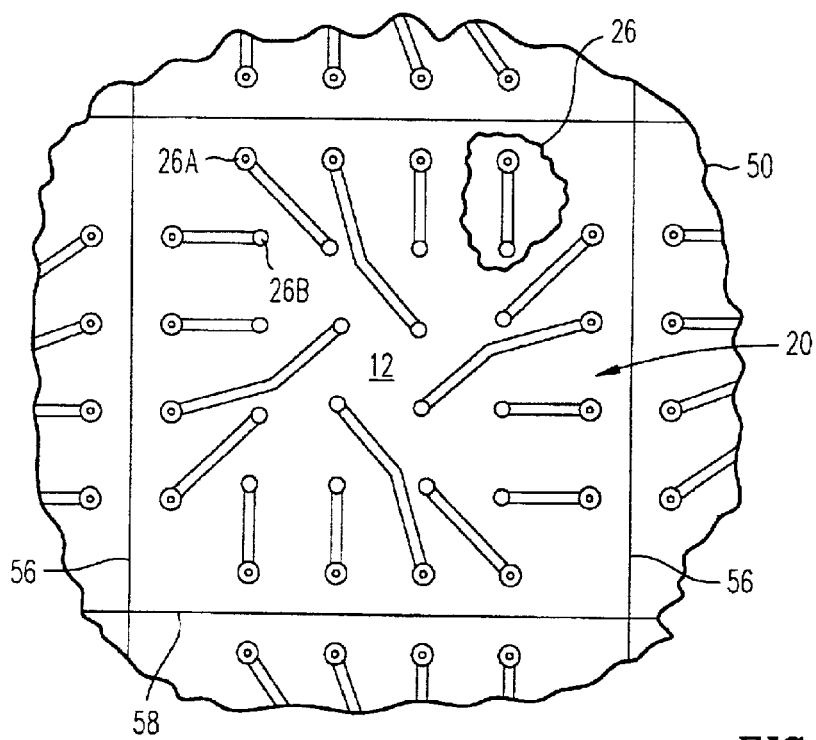

FIG. 4C is a bottom plan view of region 50 of substrate 13 from FIG. 3A illustrating a plurality of metallizations 26 formed on second surface 20 of substrate 13. In FIG. 4C, solder mask 39 is not illustrated for purposes of clarity.

As shown in FIG. 4C, each metallization 26 has a first end 26A which is electrically connected to a conductive through-hole 14 and a second end 26B. Metallizations 26 are formed using conventional techniques such as by forming a conductive layer on second surface 20 and then by masking and etching the conductive layer. Contacts 27 (not shown in FIG. 4C for purposes of clarity) are formed on metallizations 26 at second ends 26B.

Figure 5A:
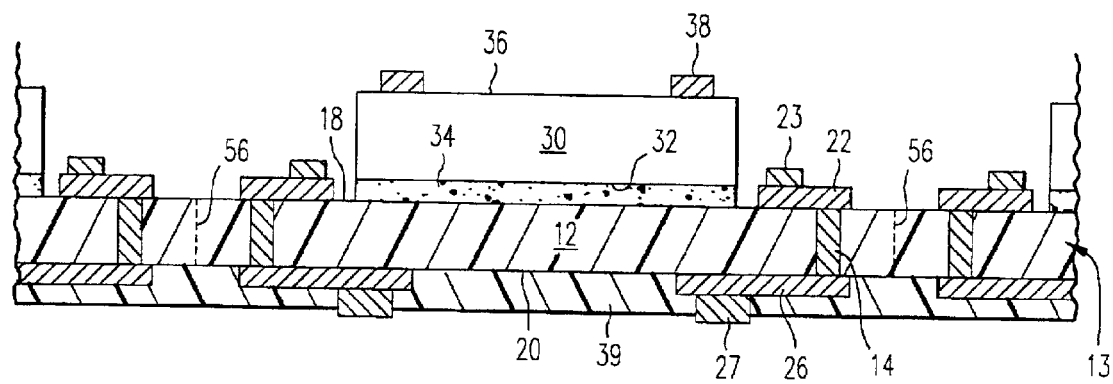
FIGS. 5A, 6A, 7 and 5B, 6B are cross-sectional and top plan views, respectively, of a package at various stages during fabrication in accordance with the present invention.
Figure 5B:
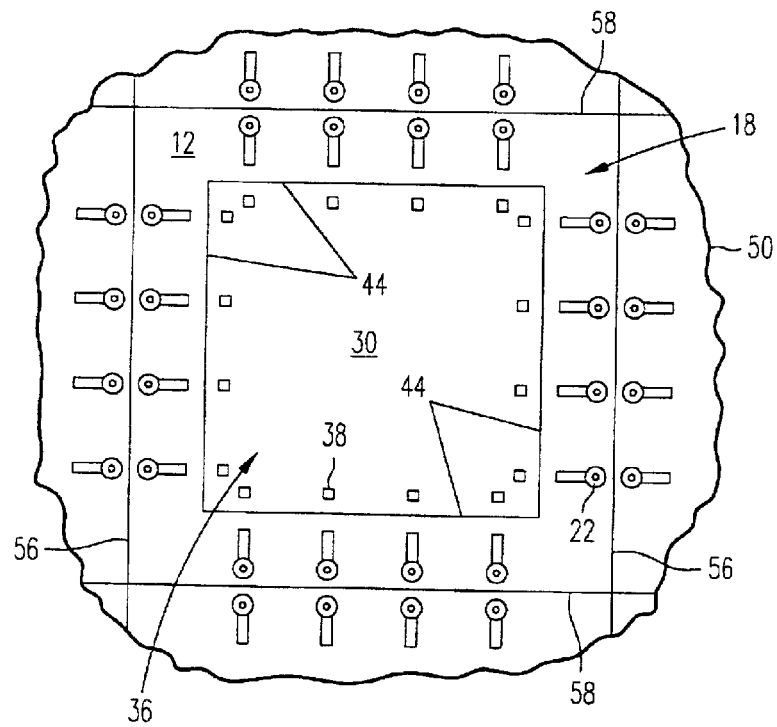

FIGS. 5A and 5B are cross-sectional and top plan views, respectively, of package 10 further along in processing. As shown in FIG. 5A, the first surface 32 of IC chip 30 is mounted to first surface 18 of substrate 13 by a layer of adhesive 34. Adhesive 34 is preferably epoxy adhesive such as Ablestick 965-IL or 8360, QMI 595 or an equivalent.

As shown in FIG. 5B, IC chip 30 is mounted to section 12 in a location central to metallizations 22 and in one embodiment the distance between the edges 44 of IC chip 30 and metallizations 22 is approximately 10 mils. Also shown are bonding pads 38 located on a second surface 36 of IC chip 30. In FIG. 5B, metallizations 22 are illustrated adjacent all four edges 44 of IC chip 30. However, in an alternative embodiment, metallizations 22 are not formed along one or more edges 44. In this alternative embodiment, the distance between an edge 44 not having adjacent metallizations 22 and line 56 (or 58) can be reduced as compared to the distance between an edge 44 having adjacent metallization 22 and line 56 (or 58). For example, the distance is reduced to 15 mils.

Figure 6A:
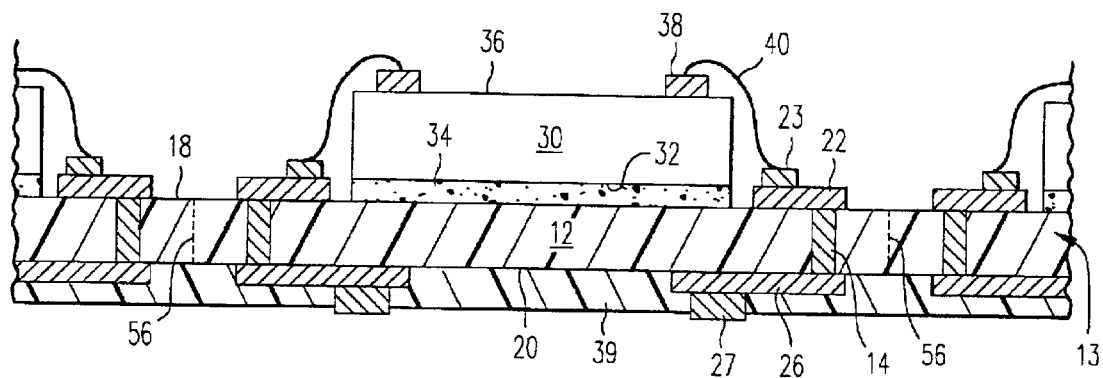
Figure 6B:
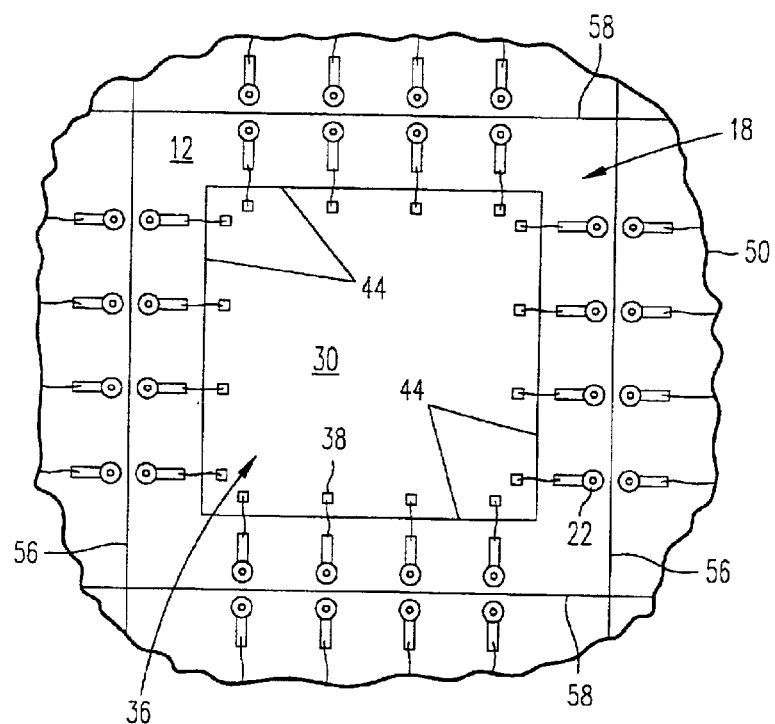

FIGS. 6A and 6B are cross-sectional and top plan views, respectively, of package 10 further along in processing. As shown in FIGS. 6A and 6B, bonding pads 38 are electrically connected to corresponding contacts 23 by bond wires 40, made of gold or aluminum for example, using conventional wire bonding techniques. Examples of suitable wire bonding techniques include gold ultrasonic, aluminum ultrasonic and gold thermocompression techniques. By using gold plated contacts 23, a better bond is formed between metallization 22 and bond wire 40. However, in an alternative embodiment, contacts 23 are not formed and bond wire 40 is directly bonded to the corresponding metallization 22.

In an alternative embodiment (not shown) instead of mounting first surface 32 of IC chip 30 to first surface 18 of substrate 13 and electrically correcting bonding pads 38 to metallizations 22 using bond wires 40 as illustrated in FIGS. 5A, 5B, 6A, 6B, IC chip 30 is mounted to substrate 13 using a flip chip interconnection. In this embodiment (not shown), second surface 36 of IC chip 30 is placed adjacent first surface 18 of substrate 13 and bonding pads 38 are electrically connected to metallizations 22 directly, for example by solder. An underfill material 37 (See FIG. 2) is applied to fill the space between IC chip 30 and substrate 12 and also to encapsulate the flip chip interconnection between bonding pads 38 and metallizations 22. For example, the underfill material is Dexter Hysol 4511, Alpha Metals EL18, Hokuriku XF8413 or an equivalent. In all other aspects, processing is identical to processing used to fabricate package 10 in FIG. 1 and results in package 10A in FIG. 2.

Figure 7:
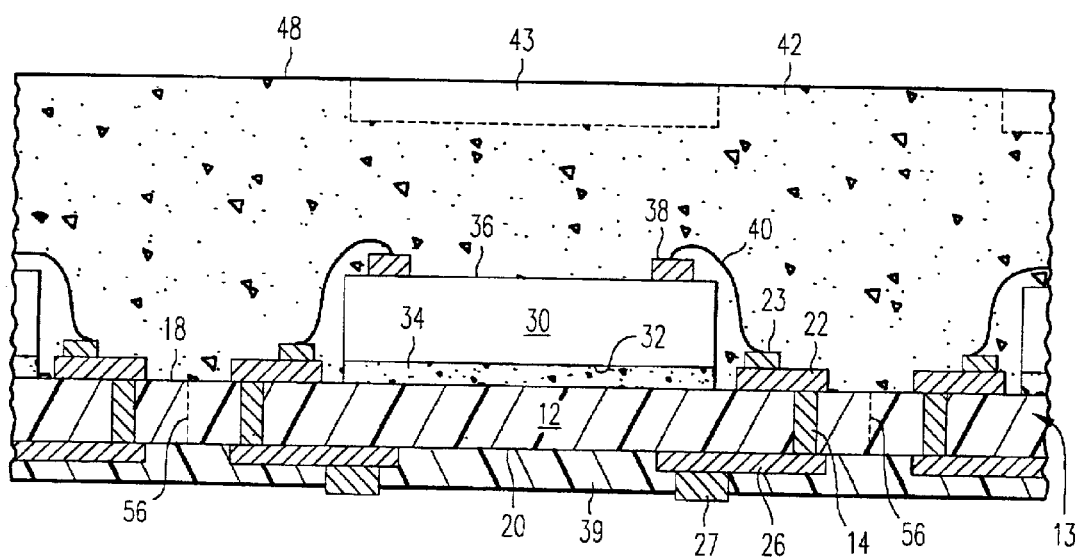

FIG. 7 is a cross-sectional view of package 10 further along in processing. As shown in FIG. 7, a layer of encapsulant 42 is applied over the entire assembly. In particular, layer of encapsulant 42 covers IC chip 30 including bonding pads 38, bond wires 40, contacts 23, metallizations 22 and the remaining exposed first surface 18 of substrate 13. Layer of encapsulant 42 is formed of an electrically insulating encapsulant and preferably is Dexter Hysol 4450 or 4451 or an equivalent. Layer of encapsulant 42 can be laser marked for product identification using conventional laser marking techniques.

As illustrated by the dashed rectangle in FIG. 7, a heat slug 43 can be embedded into layer of encapsulant 42 to improve the heat transfer from IC chip 30 to the outside environment. Heat slug 43 is typically a copper heat slug and is simply pressed into layer of encapsulant 42 as the encapsulant solidifies. Heat slug 43 is not illustrated in subsequent processing steps or-in FIGS. 1 and 2 although it is understood that a heat slug can be incorporated into the embodiments illustrated by these figures.

Referring back to FIGS. 3A and 3B, and in particular to FIG. 3B, layer of encapsulant 42 is applied by filling the pocket defined by dam 59 with encapsulant. Dam 59 prevents layer of encapsulant 42 from flowing off of first surface 18 of substrate 13. Preferably, dam 59 has a height indicated by dashed line 68 above first surface 18 greater than or equal to the height of upper surface 48 of layer of encapsulant 42 (FIG. 7) above first surface 18.

Figure 8A:
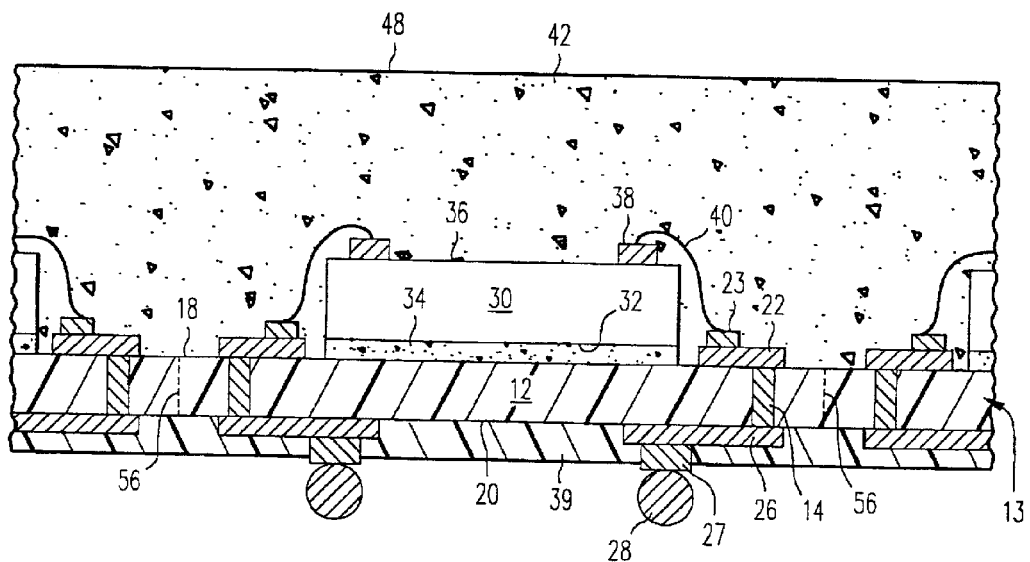
FIGS. 8A and 8B are cross-sectional and bottom plan views, respectively, of a package further along in fabrication in accordance with the present invention.
Figure 8B:
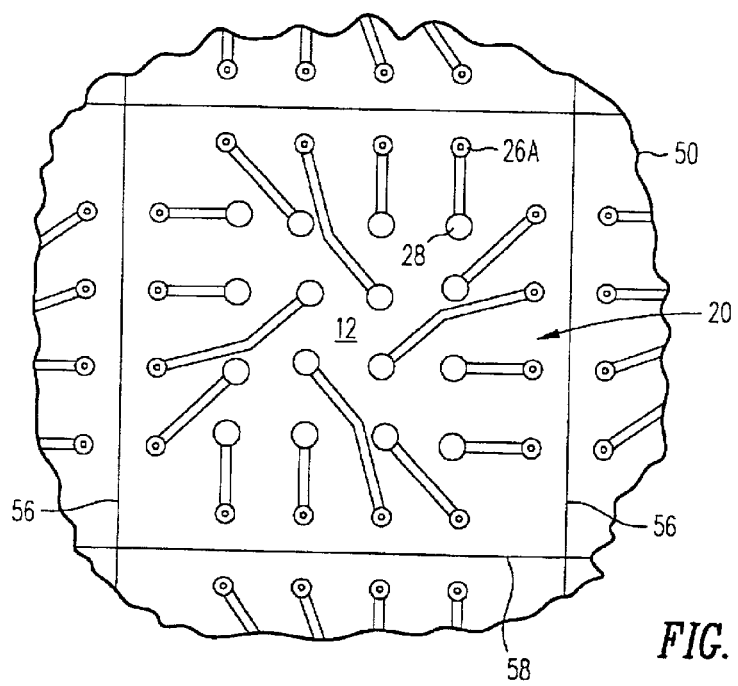

FIGS. 8A and 8B are cross-sectional and bottom plan views, respectively, of package 10 further along in processing. In FIG. 8B, solder mask 39 is not shown for purposes of clarity. As shown in FIG. 8A, interconnection balls 28, typically eutectic solder balls, preferably made of 63% tin and 3711 lead, are attached to contacts 27 using conventional techniques.

As shown in FIG. 8B, interconnection balls 28 are arranged in an array thus forming a ball grid array. Although the formation of a package including interconnection balls 28 is described, in alternative embodiments, contacts 27 form interconnection pads for electrical interconnection with other components and interconnection balls 28 are not formed. Further, the interconnection balls or pads can be arranged adjacent the perimeter of section 12, i.e. can be arranged near lines 56 and/or lines 58, instead of being arranged in an array fashion as in FIG. 8B.

In an alternative embodiment, the interconnection balls or the interconnection pads are formed at substrate bonding locations on second surface 20 of substrate 12. As described in reference to FIG. 1, the interconnection balls or interconnection pads formed at the substrate bonding locations are electrically coupled to metallizations 22 by electrically conductive traces and/or vias of substrate 12. Thus, in this alternative embodiment, metallizations 26 may not be present on second surface 20 of substrate 12, for example when the substrate bonding locations are at the end of electrically conductive vias.

Referring to FIG. 8A and FIG. 8C, substrate 13 and layer of encapsulant 42 are then cut, typically by sawing, along lines 56, 58 (best seen in FIG. 3A) to form package 10 (FIG. 1). Referring to FIG. 8C, a blue wafer mounting tape 57 (available from Nitto for example) conventionally used to hold a wafer while it is cut into individual IC chips can be used to hold substrate 13 while substrate 13 and layer of encapsulant 42 are cut to form package 10 as those skilled in the art will understand. Cutting substrate 13 simultaneously with layer of encapsulant 42 forms a package 10 with edges 43 (see FIG. 1) of layer of encapsulant 42 coincident with edges 46 of substrate 12. It is understood that in this embodiment substrate 12 (FIG. 1) in each package 10 is a section of the larger substrate 13 (FIG. 3A).

Referring to FIG. 8D, after substrate 13 and layer of encapsulant 42 are cut, yet while the individual packages 10 are still mounted on the blue wafer mounting tape 57, each package 10 is tested and bad packages are marked. (Substrate 13 is mounted onto the blue wafer mounting tape 57 with layer of encapsulant 42 facing down onto the blue wafer mounting tape 57 and interconnection balls 28 facing up.) Testing involves contacting interconnection balls 28 (which are conveniently facing upwards) with test probes or contacts as is known to those skilled in the art. Testing the plurality of packages together while the packages are still mounted on the blue wafer mounting tape is faster and advantageously reduces testing cost as compared to placing each package into a tester individually and then testing the package.

For simplicity only a few bonding pads 38 are illustrated on IC chip 30 in the above figures. However, it is understood that typically a large number of bonding pads 38 with corresponding leads, i.e., with corresponding electrically conductive pathways formed by bond wires 40, contacts 23, metallizations 22, conductive through-holes 14, metallizations 26, contacts 27 and interconnection balls 28, are formed depending upon the particular input/output (I/O) requirements of the device. Generally, the number of bonding pads 38 with corresponding leads is less than 300 and typically is less than 64.

Referring again to FIG. 3A, fabricating a plurality of packages simultaneously, in contrast to individually, from a single substrate 13 advantageously reduces handling costs thereby reducing the cost of fabricating each individual package. Further, by fabricating a plurality of packages simultaneously from a single substrate 13, waste or trimming of substrate 13 is reduced or essentially eliminated thereby further reducing the cost of fabricating each individual package. (In contrast, when individual integrated circuit packages are fabricated, the substrate is slightly oversized to allow handling of the substrate, and the excess substrate is trimmed in subsequent fabrication steps.)

The cost of fabricating each individual package can be further reduced by properly sizing substrate 13. In particular, by using a rectangular substrate 13 which is sized to correspond with the number of packages being fabricated, waste of substrate 13 is minimized or essentially eliminated. For example, if IC chip 30 has an area equal to 0.04 in2 (200 mil×200 mil) and dimension A (FIG. 1) is 25 mil, then substrate 13 should have lateral and vertical dimensions equal to multiples of 250 mil depending upon the number of packages to be formed from substrate 13 (200 mil for each IC chip 30 plus 2×25 mil or 50 mil for dimension A on both sides of each IC chip 30). Thus, in this example, for a 2"×2" substrate 13, 64 packages can be formed simultaneously. However, it is understood that substrates with other dimensions and shapes can be used, for example a circular substrate can be used. Further, it is understood that the number of packages fabricated per substrate and the amount of substrate waste or trimmings generate from a substrate are determined by the substrate size, the size of the IC chip and the dimension A.

In another embodiment, the size of package 10 (FIG. 1) is determined by the leadcount, i.e. by the number of interconnection balls 28 which must be formed. For this embodiment, relevant parameters for a given interconnection ball diameter are presented in Table 1.

TABLE I

| Ball diameter (inches) | Minimum substrate edge to ball distance (inches) | Minimum Ball Pitch (mm) | Minimum Ball Height (inches) |
| --- | --- | --- | --- |
| 0.012 | 0.015 | 0.50 | 0.007 |
| 0.015 | 0.017 | 0.50 | 0.010 |
| 0.020 | 0.019 | 0.75 | 0.013 |
| 0.025 | 0.020 | 1.00 | 0.015 |
| 0.030 | 0.023 | 1.27 | 0.019 |

In Table 1, minimum substrate edge to ball distance refers to the minimum distance between any interconnection balls 28 (FIG. 1) and edge 46 of substrate 12. Minimum ball pitch is the minimum spacing between interconnection balls. Thus, for a given number of interconnection balls having a given ball diameter, the size of substrate 12 needed to accommodate the interconnection balls can be readily calculated by knowing the minimum ball pitch and minimum substrate edge to ball distance as provided in Table 1.

The minimum ball height in Table 1 refers to the additional thickness added by interconnection balls 28 to dimension B (FIG. 1) after interconnection balls 28 have been reflowed (interconnection balls 28 are reflowed to interconnect package 10 to other electrical components such as to a printed circuit board).

FIGS. 9, 10, 11, 12 and 13 are top plan views of various features of a substrate in accordance with this embodiment of the present invention.

Figure 9:
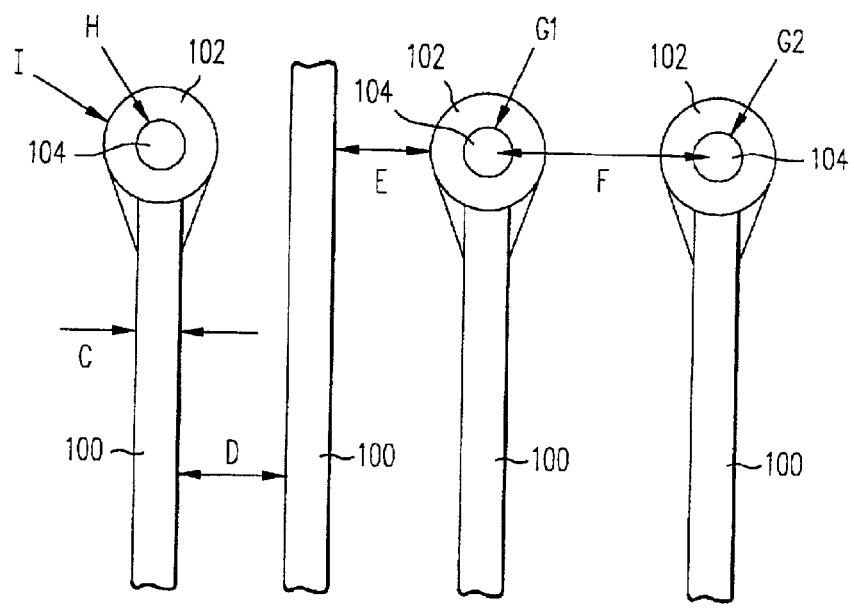
FIGS. 9, 10, 11, 12 and 13 are top plan views of various features of a substrate in accordance with another embodiment of the present invention.

FIG. 9 illustrates conductive lines 100 and via lands 102 including vias 104. In this embodiment, the minimum width C of lines 100 is 0.003 in. The minimum spacing D between lines 100 is 0.004 in. The minimum spacing E between a line 100 and a via land 102 is 0.0035 in. The minimum via center to via center spacing F is 0.5 G1 plus 0.5 G2 plus 0.010 in. ((½)G1+(½) G2+0.010 in.) where G1 and G2 are the diameters of the adjacent vias 104. The minimum diameter H of any via 104 is 0.010 in. for substrates less than 0.024 in. thick and 0.012 in. for substrates thicker than 0.024 in. The minimum diameter I of any via land 102 is diameter H of via 104 plus 0.006 in. (H+0.006 in.).

Figure 10:
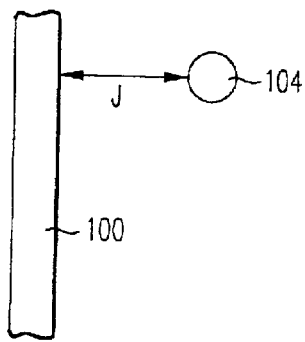

FIG. 10 illustrates the minimum spacing J between a line 100 on an internal layer of a multilayered substrate and a via 104 passing through the internal layer in accordance with this embodiment of the invention. The minimum spacing J is 0.0035 in.

Figure 11:
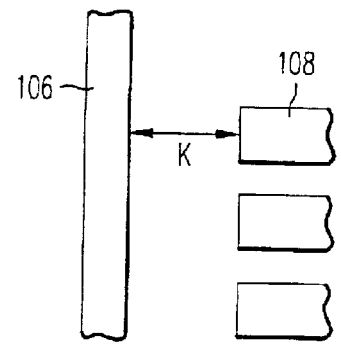

FIG. 11 illustrates the minimum spacing K between a metallization 106 covered by a solder mask (not shown) and a metallization 108 not covered by a solder mask. The minimum spacing K is 0.007 in. Note that the minimum spacing K is greater than the minimum spacing D between lines 100 (FIG. 9) since the minimum spacing K must include tolerances associated with the placement of the solder mask.

Figure 12:
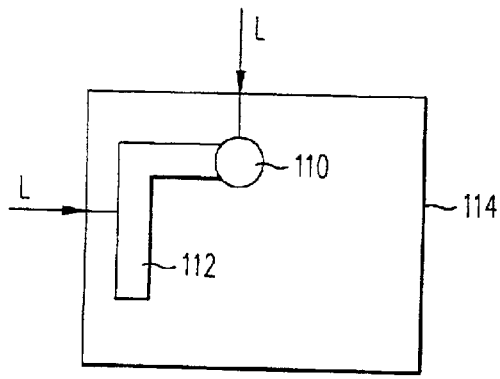

FIG. 12 illustrates the minimum spacing L between any via 110, metallization or other feature 112 and any edge 114 of the substrate. Edge 114 refers to the edge of a substrate from which a plurality of CHIPARRAY™ packages are fabricated. (For example, one of the four edges of substrate 13 in FIG. 3A, i.e. one of the edges of substrate 13 adjacent dam 59.) The minimum spacing L is 0.008 in.

Figure 13:
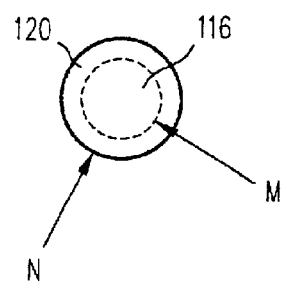

FIG. 13 illustrates the minimum diameter M of a solder mask defined opening 116 and the minimum diameter N of a contact 120 upon which an interconnection ball will be formed for a solder mask defined contact. The minimum diameter M is 0.006 in. The minimum diameter N is greater than the minimum diameter M. However, in an alternative embodiment, non-solder mask defined contacts are used. In this alternative embodiment, 116 is the contact, 120 is the solder mask defined opening, diameter M is the minimum diameter of the contact 116 and diameter N is the minimum diameter of the solder mask defined opening 120. In either embodiment, the interconnection ball formed on the contact will be confined to the diameter M.

Figure 14:
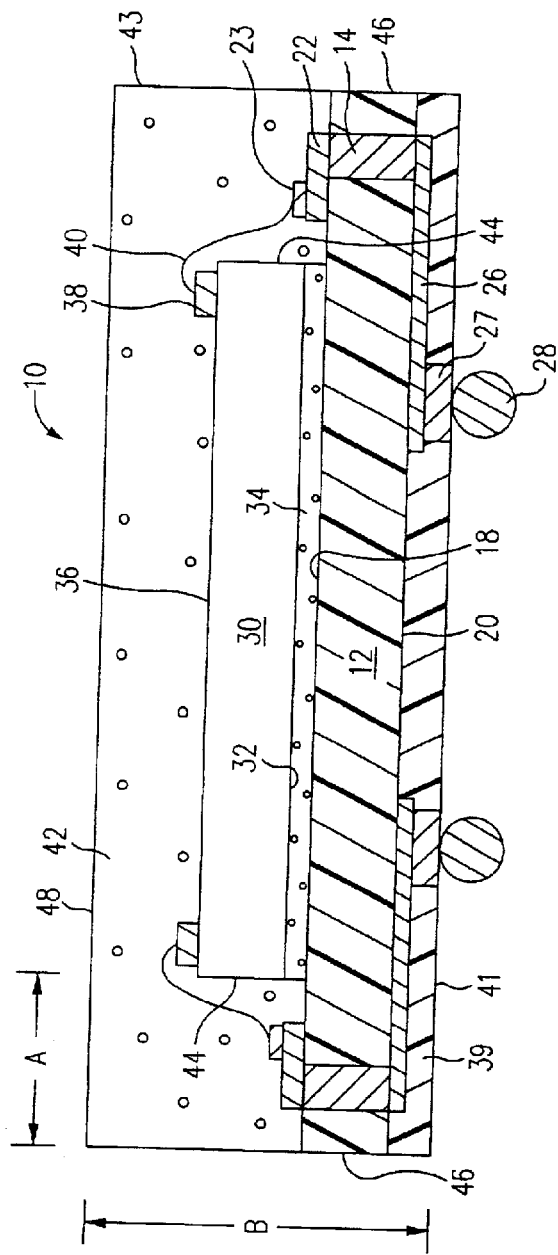
FIGS. 14 and 15 are cross-sectional views of shielded packages in accordance with alternative embodiments of the present invention.

FIG. 14 is a cross-sectional view of a shielded package 10B in accordance with an alternative embodiment of the present invention. Shielded package 10B of FIG. 14 is substantially similar to package 10 of FIG. 1 except for the inclusion of an electrically conductive shield layer 150. Referring to FIG. 14, shield layer 150 is formed on upper surface 48 of layer of encapsulant 42. Shield layer 150 has edges 152 which are coincident with edges 43 of layer of encapsulant 42 and edges 46 of substrate 12. Further, shield layer 150 has a planar upper surface 154 and has a substantially uniform thickness C between surfaces 48 and 154. In one embodiment, thickness C is in the range of 8 to 10 mil.

Shield layer 150 is formed of a flowable electrically conductive material which has been cured. For example, shield layer 150 is formed from a polymer containing an electrically conductive filler (hereinafter referred to as an electrically conductive liquid encapsulant). Shield layer 150 is electrically isolated from IC chip 30 and the various electrical conductors (i.e. bonding pads 38, bond wires 40, contacts 23 and metallizations 22) by layer of encapsulant 42 which is an electrically insulating material.

Typically, layer of encapsulant 42 is formed of a polymer which is similar to, or the same as, the polymer of shield layer 150. This avoids difficulties such as mismatch in the thermal coefficient of expansion between shield layer 150 and layer of encapsulant 42 and improves physical bonding between shield layer 150 and layer of encapsulant 42.

Shield layer 150, being an electrically conductive layer, forms a floating ground plane which shields IC chip 30 and the remainder of shielded package 10B. Thus, shield layer 150 prevents external radiation from interfering with the operation of shielded package 10B and also prevents shielded package 10B from emitting radiation which could interfere with other electronic components and devices. (Some minimal amount of radiation may pass in/out of shielded package 10B through edges 43 of layer of encapsulant 42 and through substrate 12. However, this is acceptable for most applications since a certain amount of radiation is tolerable without any loss of performance.)

Forming shield layer 150 from an electrically conductive encapsulant in contrast to a preformed metal sheet advantageously reduces the cost and weight of shielded package 10B. Further, the problems associated with embedding a metal sheet into encapsulant (e.g. delamination and thermal cracking) are avoided.

Figure 15:
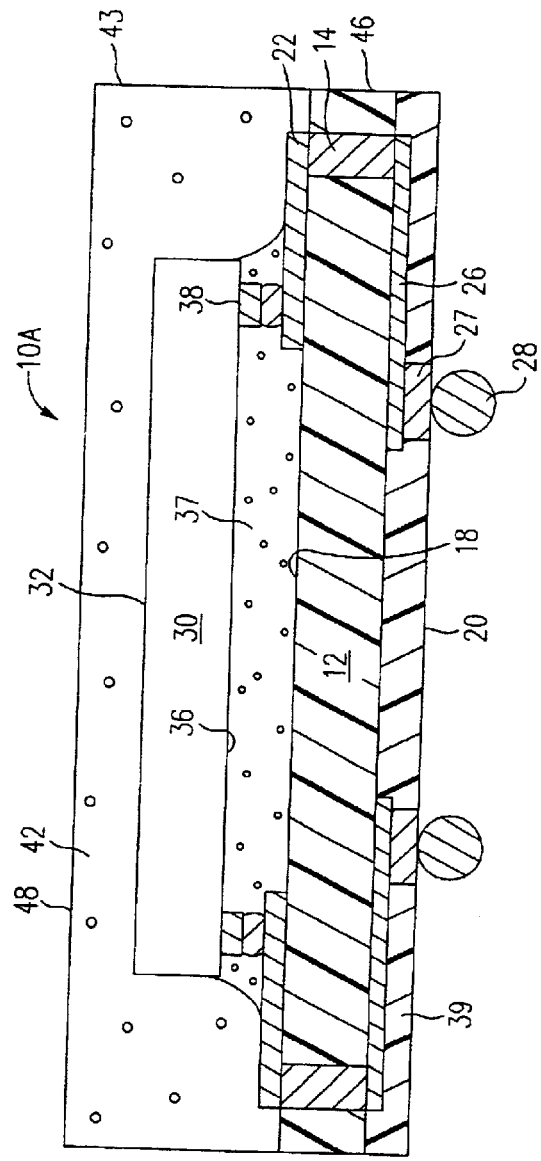

FIG. 15 is a cross-sectional view of a shielded package 10C in accordance with an alternative embodiment of the present invention. Shielded package 10C of FIG. 15 is substantially similar to shielded package 10B of FIG. 14 except that a flip-chip interconnection is used to mount IC chip 30 to substrate 12.

Figure 16:
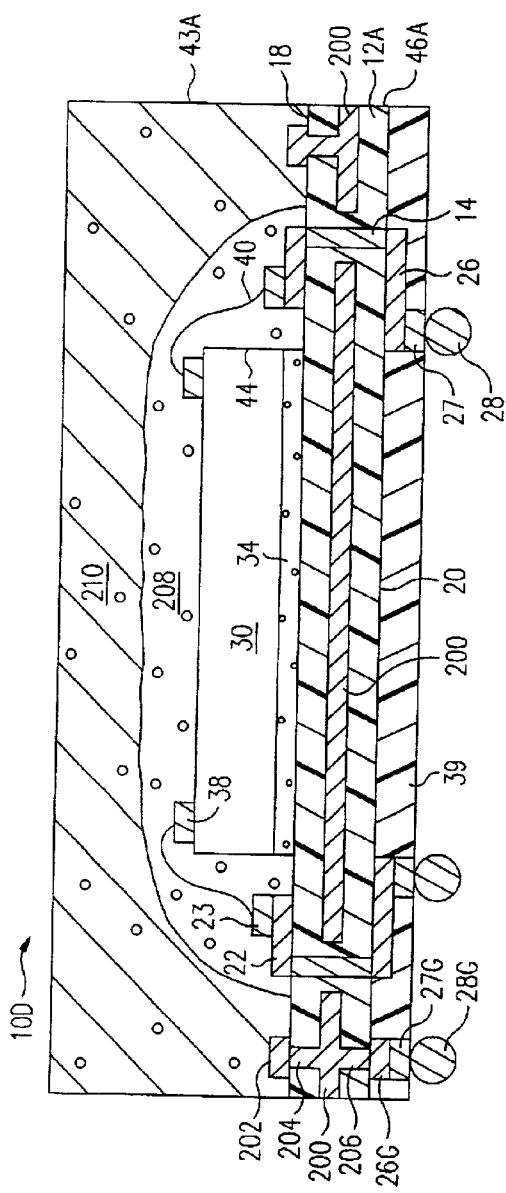
FIGS. 16 and 17 are cross-sectional views of fully shielded packages in accordance with other alternative embodiments of the present invention.

FIG. 16 is a cross-sectional view of a fully shielded package 10D in accordance with an alternative embodiment of the present invention. Referring to FIG. 16, substrate 12A includes an internal ground plane 200. Ground plane 200 has apertures through which conductive through-holes 14 pass. Thus, ground plane 200 is electrically isolated from conductive through-holes 14. Ground plane 200 is electrically connected to at least one ground contact 202 on first surface 18 of substrate 12A by electrically conductive through-holes 204. Ground plane 200 is also electrically connected to at least one ground interconnection ball 28G by electrically conductive through-holes 206, trace 26G and contacts 27G.

As shown in FIG. 16, IC chip 30, including bonding pads 38, bond wires 40, contacts 23 and metallizations 22, are enclosed in an encapsulant cap 208 formed of an electrically insulating encapsulant. Of importance, encapsulant cap 208 only encloses a portion of first surface 18 of substrate 12A inward of ground contacts 202, i.e. does not enclose ground contacts 202. The remaining portion of first surface 18 of substrate 12A, including ground contacts 202, and encapsulant cap 208, are enclosed in a shield layer 210 formed of an electrically conductive liquid encapsulant similar to that of shield layer 150 of FIG. 14. As shown in FIG. 16, shield layer 210 has edges 43A which are coincident with edges 46A of substrate 12A.

Shield layer 210 is electrically connected to ground plane 200 by ground contacts 202 and through-holes 204. In accordance with this embodiment, IC chip 30 is fully shielded. More particularly, IC chip 30 is shielded from the top and sides by electrically conductive shield layer 210. IC chip 30 is shielded from below by ground plane 200. Advantageously, shield layer 210 and ground plane 200, which are electrically connected and at a common potential, can be electrically connected to an external reference voltage (e.g. ground) by interconnection balls 28G.

In contrast to the shielded IC chip package of Lin (discussed above), fully shielded package 10D does not contain any encapsulant dams (see dam structures 40, 44 of Lin). Accordingly, fully shielded package 10D is fabricated without having to provide substrate area for dam structures. This enables a reduction in the distance between edges 44 of IC chip 30 and edges 46A of substrate 12A, i.e. enables fully shielded package 10D to be near chip size.

Figure 17:
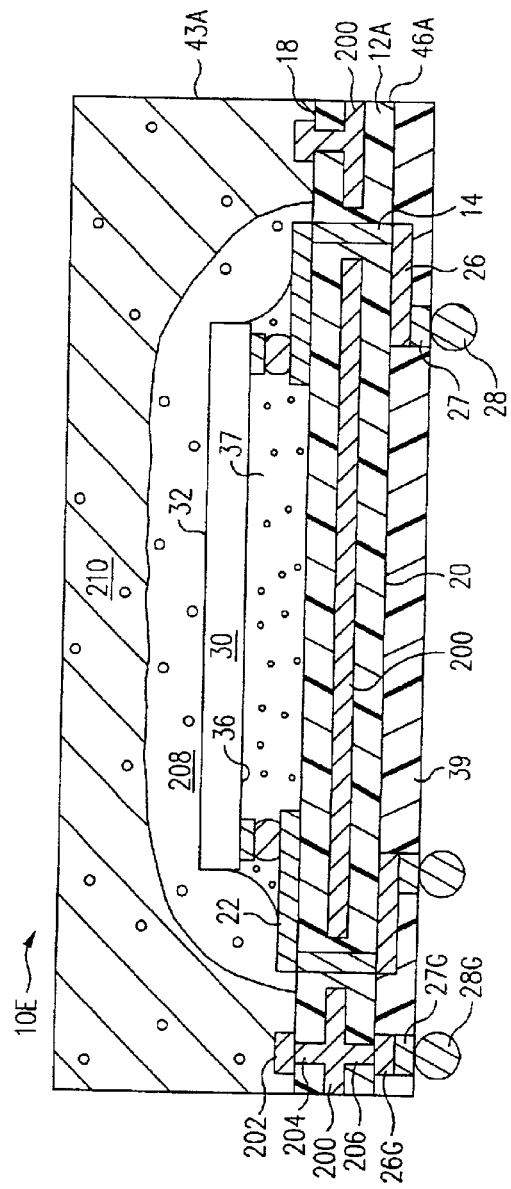

FIG. 17 is a cross-sectional view of a fully shielded package 10E in accordance with an alternative embodiment of the present invention. Package 10E of FIG. 17 is substantially similar to package 10D of FIG. 16 except that a flip-chip interconnection is used to mount IC chip 30 to substrate 12.

Figure 18:
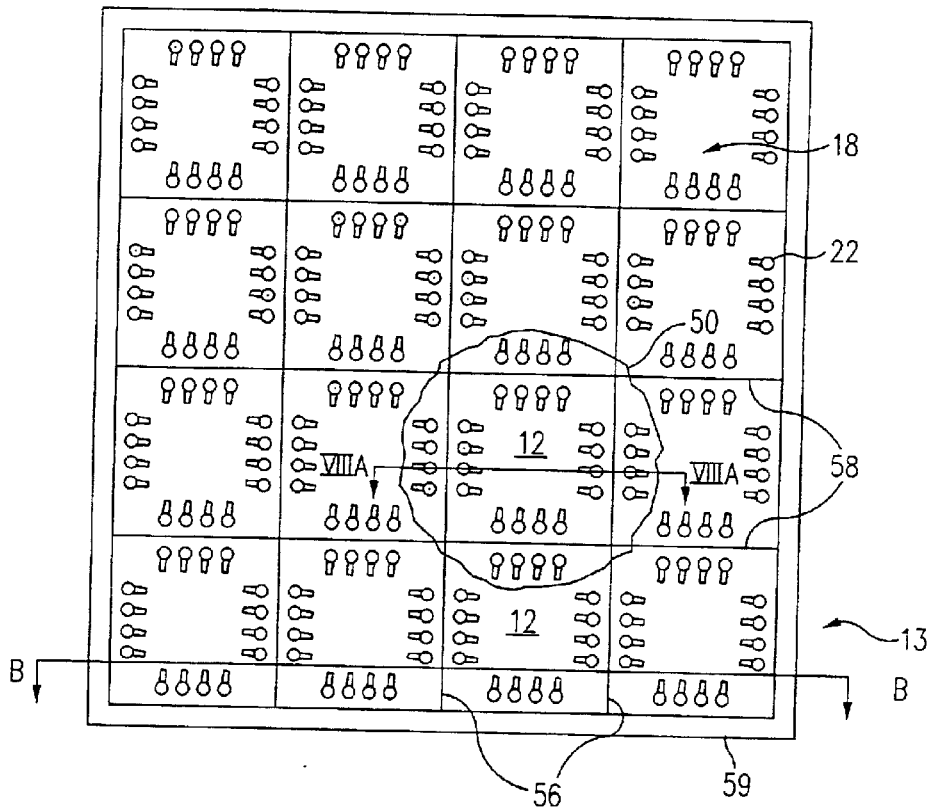
FIGS. 18A and 18C are top plan and bottom plan views, respectively, of a substrate in accordance with the present invention.
FIG. 18B is a cross-sectional view along the line B—B of FIG. 18A of the substrate.
Figure 18:
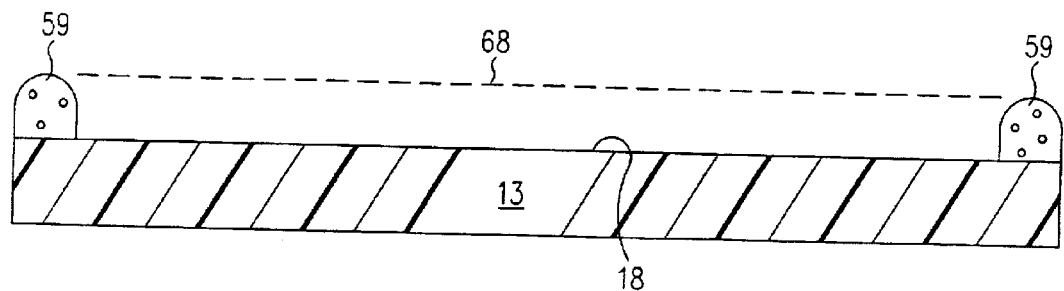

FIG. 18A is an enlarged top plan view of a substrate 13 in accordance with the present invention. In FIG. 18A, a plurality of lines 56 oriented in the vertical direction, as well as a plurality of lines 58 oriented in the horizontal direction are illustrated. Lines 56 and 58 are included in the following figures to clarify the sections 12 where each individual package is to be formed, the formation of which is described in detail below. (For clarity, in FIG. 18A only two sections 12 are labeled). As shown in FIG. 18A, the periphery of each section 12 is defined by lines 56, 58. However, in an alternative embodiment, instead of lines 56, 58, alignment marks are provided for aligning substrate 13 in subsequent processing step such as those described below. Substrate 13 is preferably a square or rectangular substrate, for example is a 2.0 in.×2.0 in. (5.1 cm×5.1 cm), a 3.0 in.×3.0 in. (7.6 cm×7.6 cm) or a 4.0 in. ×4.0 in. (10.2 cm×10.2 cm) square substrate.

As shown in FIG. 18A, a dam 59 is formed on a first surface 18 of substrate 13 around the perimeter of substrate 13. Dam 59 encloses sections 12, yet does not extend into any of the section 12.

FIG. 18B is a cross-sectional view along the line B—B of FIG. 18A of substrate 13. In FIG. 18B, metallizations, conductive through-holes and other features are not illustrated for clarity. As shown in FIG. 18B, dam 59 extends from first surface 18 to a predetermined height indicated by dashed line 68 above first surface 18 thereby defining a pocket which can be filled with one or more encapsulants as described in more detail below.

Dam 59 can be any material suitable for preventing encapsulant from flowing off of substrate 13. In one embodiment, dam 59 is formed by applying and curing an encapsulant (e.g. from a needle dispenser) such as Dexter Hysol 4450 or 4451 or an equivalent.

Referring back to FIG. 18A, each section 12 of substrate 13 has a plurality of metallizations 22 formed on first surface 18 of substrate 13, a plurality of contacts 23 (not shown) formed on metallizations 22 and a plurality of conductive through-holes 14 (not shown) formed through substrate 13. Metallizations 22 are formed using conventional techniques such as by forming a conductive layer on first surface 18 and then by masking and etching the conductive layer. Conductive through-holes 14 are also formed using conventional techniques such as by drilling through-holes in substrate 13 and then plating the drilled through-holes with a conductive metal such as copper.

Figure 18C:
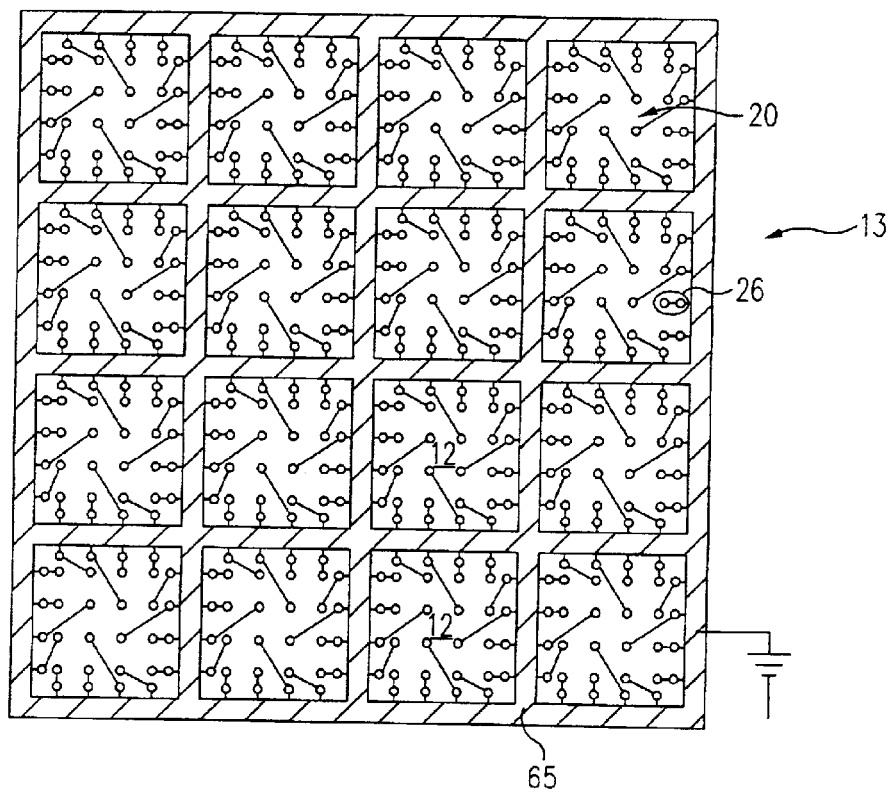

FIG. 18C is a bottom plan view of substrate 13. In FIG. 18C, solder mask 39 is not illustrated for purposes of clarify. As shown in FIG. 18C, around the perimeter of each section 12 on second surface 20 of substrate 13 is a reference grid 65. Reference grid 65 is formed of an electrically conductive material (e.g. the material of metallizations 26) and is typically formed simultaneously with the formation of metallizations 26 (e.g. during the same masking and etching steps used to form metallizations 26).

Metallizations 26 on second surface 20 of substrate 13 are electrically coupled to reference grid 65. In this manner, metallizations 26, conductive through-holes 14 (not shown) and metallizations 22 (not shown) of substrate 13 are electrically coupled to one another and thus are held at a common potential. This enables a voltage to be applied to metallizations 26, 22 and through-holes 14, e.g. for electroplating contacts 23, 27. Further, as shown in FIG. 18C, reference grid 65 can be electrically connected to an external reference voltage (e.g. ground). Connecting reference grid 65 to ground prevents any transient electrical change from accumulating on (i.e. shorts) metallizations 26, 22 and through-holes 14. In this manner, IC chips 30 are protected from damage due to electrostatic discharge.

FIGS. 19 to 24 illustrate various stages in the formation of a shielded package in accordance with the present invention. Although the formation of a single package is described for clarity, it should be understood that a plurality of packages are formed from a single substrate 13 simultaneously, one package being formed from each section 12 of substrate 13.

Figure 19A:
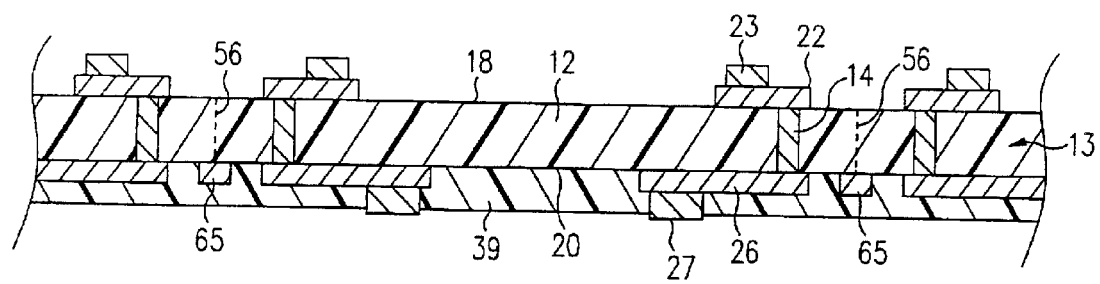
FIGS. 19A, 19B and 19C are cross-sectional (taken along the line A—A of FIG. 18A), top plan and bottom plan views, respectively, of a region of the substrate of FIG. 18A.

FIG. 19A is a cross-sectional view of substrate 13 and in particular of one of the sections 12 along the line A—A of FIG. 18A in accordance with one embodiment of the present invention. Contacts 23, metallizations 22, conductive through-holes 14, metallizations 26 and contacts 27 are illustrated in FIG. 19A. Also illustrated are solder mask 39 and reference grid 65. In the cross-section of FIG. 19A, metallizations 26 are discontinuous from reference grid 65 although if taken along a different cross-section (not shown) metallizations 26 and reference grid 65 would appear as a continuous electrical conductor.

Figure 19B:
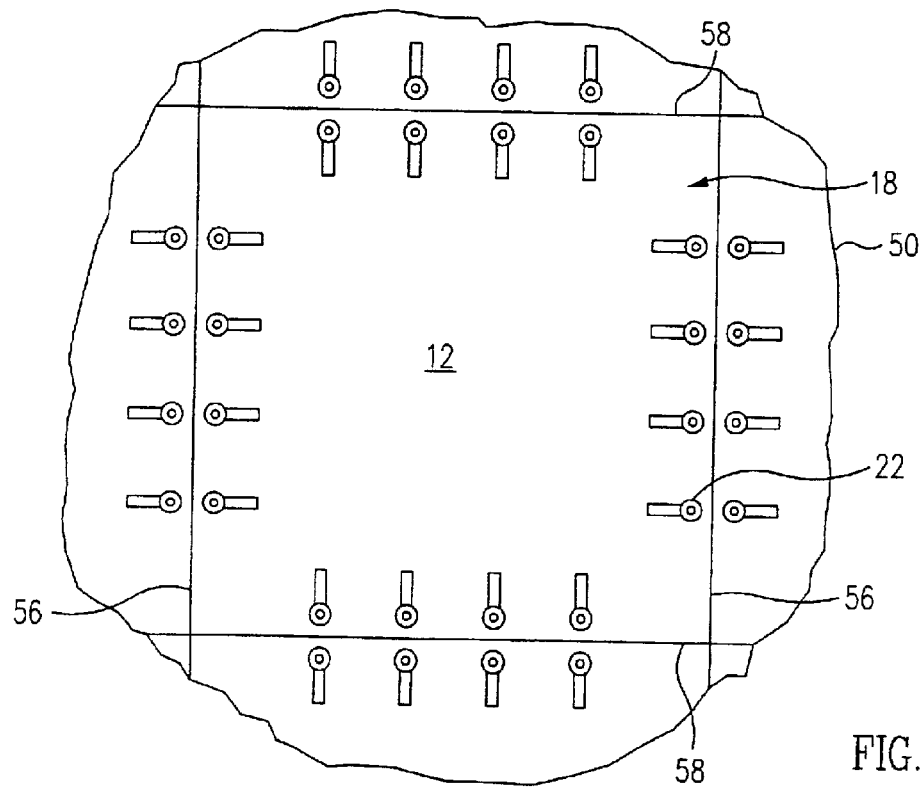

FIG. 19B is a top plan view of a region 50 of substrate 13 from FIG. 18A and in particular of one of the sections 12 illustrating metallizations 22 formed on first surface 18 of substrate 13. Contacts 23 are not illustrated in FIG. 19B for purposes of clarity. In one embodiment, metallizations 22 are a minimum of 0.017 in. long and a minimum of 0.005 in. wide although metallizations 22 with other dimensions can be used.

Figure 19C:
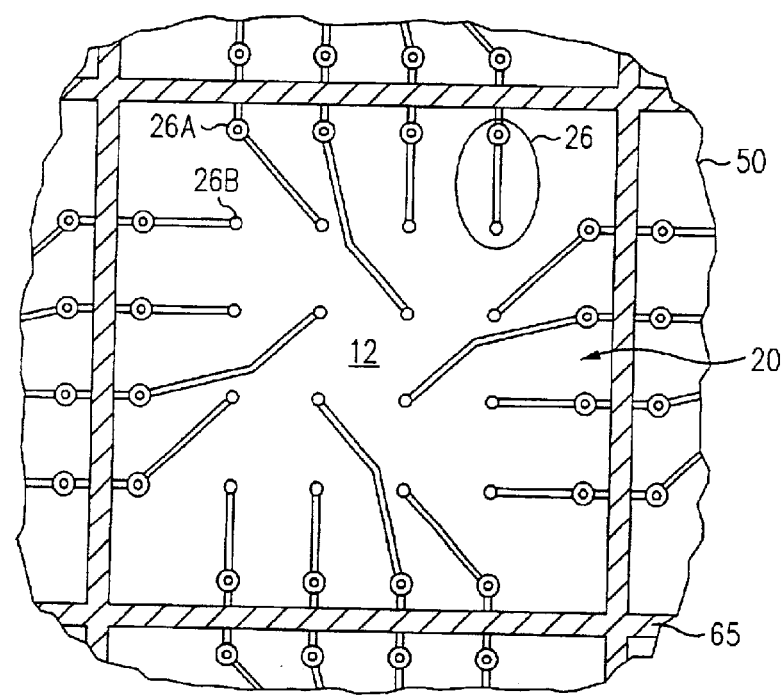
Figure 20:
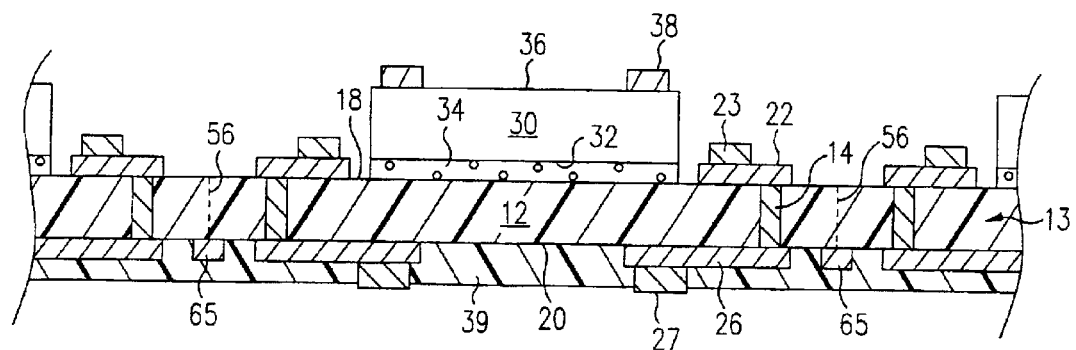
FIGS. 20A, 21A, 22, 23 and 20B, 21B are cross-sectional and top plan views, respectively, of a shielded package at various stages during fabrication in accordance with the present invention.
Figure 20:
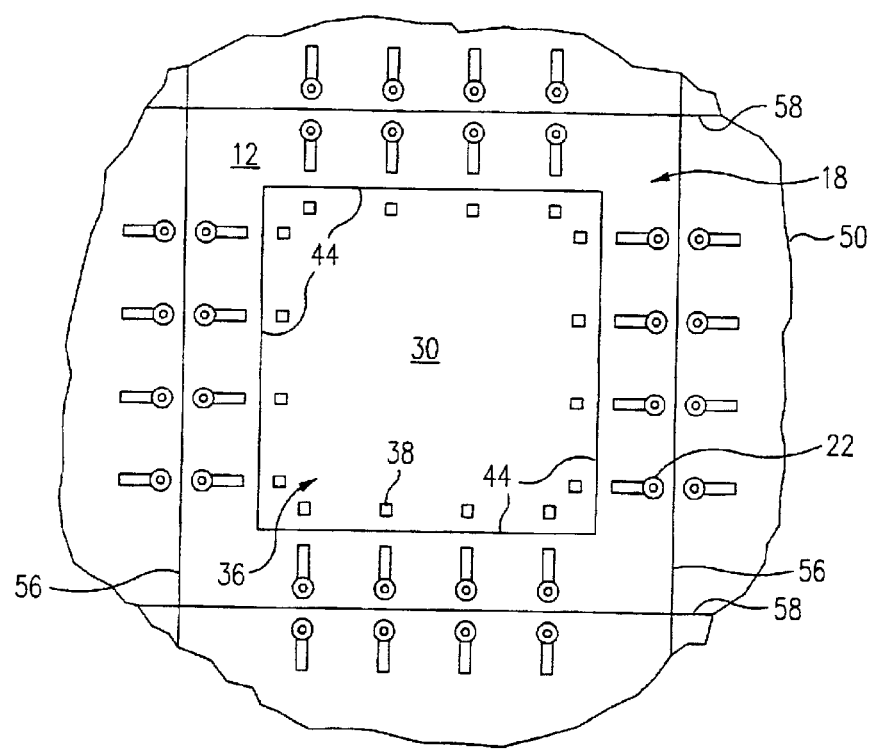

FIG. 19C is a bottom plan view of region 50 of substrate 13 from FIG. 18A illustrating a plurality of metallizations 26 formed on second surface 20 of substrate 13. In FIG. 19C, solder mask 39 is not illustrated for purposes of clarity.

As shown in FIG. 19C, each metallization 26 has a first end 26A which is electrically connected to a conductive through-hole 14 and also to reference grid 65. Metallizations 26 are formed using conventional techniques such as by forming a conductive layer on second surface 20 and then by masking and etching the conductive layer. Contacts 27 (not shown in FIG. 19C for purposes of clarity) are formed on metallizations 26 at second ends 26B.

FIGS. 20A and 20B are cross-sectional and top plan views, respectively, of shielded package 10B (FIG. 14) during fabrication. As shown in FIG. 20A, first surface 32 of IC chip 30 is mounted to first surface 18 of substrate 13 by adhesive 34. Adhesive 34 is preferably epoxy adhesive such as Ablestick 965-IL or 8360, QMI 595 or an equivalent.

As shown in FIG. 20B, IC chip 30 is mounted to section 12 in a location central to metallizations 22 and in one embodiment the distance between the edges 44 of IC chip 30 and metallizations 22 is approximately 10 mils. Also shown are bonding pads 38 located on second surface 36 of IC chip 30. In FIG. 20B, metallizations 22 are illustrated adjacent all four edges 44 of IC chip 30. However, in an alternative embodiment, metallizations 22 are not formed along one or more edges 44. In this alternative embodiment, the distance between an edge 44 not having adjacent metallizations 22 and line 56 (or 58) can be reduced as compared to the distance between an edge 44 having adjacent metallization 22 and line 56 (or 58). For example, the distance is reduced to 15 mils.

Figure 21A:
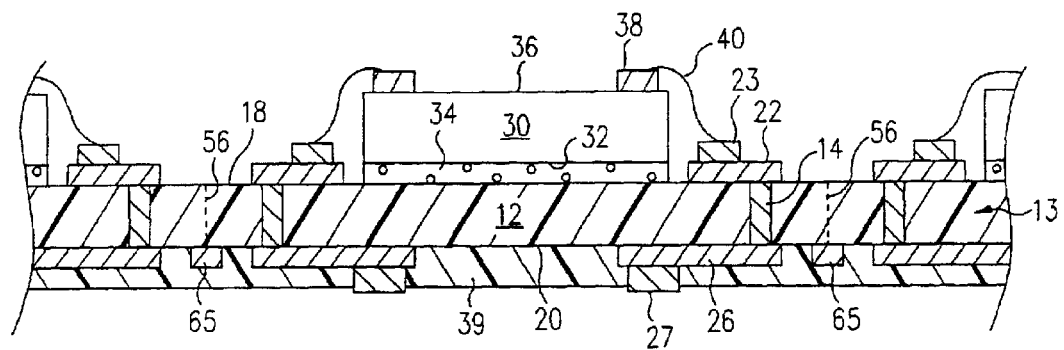
Figure 21B:
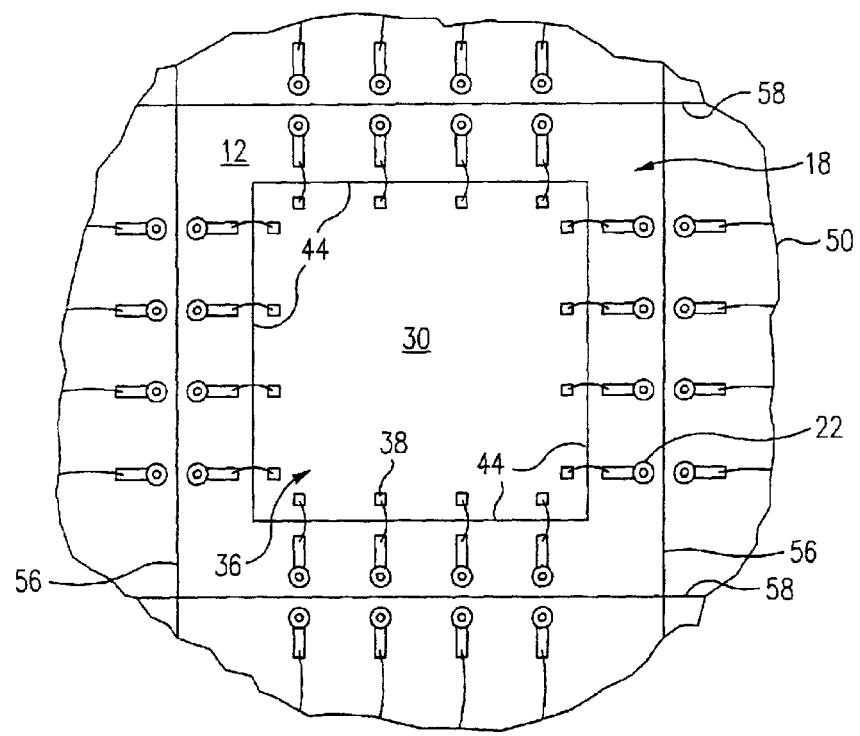

FIGS. 21A and 21B are cross-sectional and top plan views, respectively, of shielded package 10B further along in processing. As shown in FIGS. 21A and 21B, bonding pads 38 are electrically connected to corresponding contacts 23 by bond wires 40, made of gold or aluminum for example, using conventional wire bonding techniques. Examples of suitable wire bonding techniques include gold ultrasonic, aluminum ultrasonic and gold thermocompression techniques. By using gold plated contacts 23, a better bond is formed between metallizations 22 and bond wires 40. However, in an alternative embodiment, contacts 23 are not formed and bond wires 40 are directly bonded to the corresponding metallizations 22.

In an alternative embodiment (not shown) instead of mounting first surface 32 of IC chip 30 to first surface 18 of substrate 13 as illustrated in FIGS. 20A, 20B, 21A, 21B, IC chip 30 is mounted to substrate 13 using a flip chip interconnection. In this embodiment (not shown), second surface 36 of IC chip 30 is placed adjacent first surface 18 of substrate 13 and bonding pads 38 are electrically connected to metallizations 22 directly, for example by solder. An underfill material 37 (see FIG. 15) is applied to fill the space between IC chip 30 and substrate 13 and also to encapsulate the flip chip interconnection between bonding pads 38 and metallizations 22. For example, the underfill material is Dexter Hysol 4511, Alpha Metals EL18, Hokuriku XF8413 or an equivalent. In all other aspects, processing is identical to processing used to fabricate shielded package 10B in FIG. 14 and results in shielded package 10C in FIG. 15.

Figure 22:
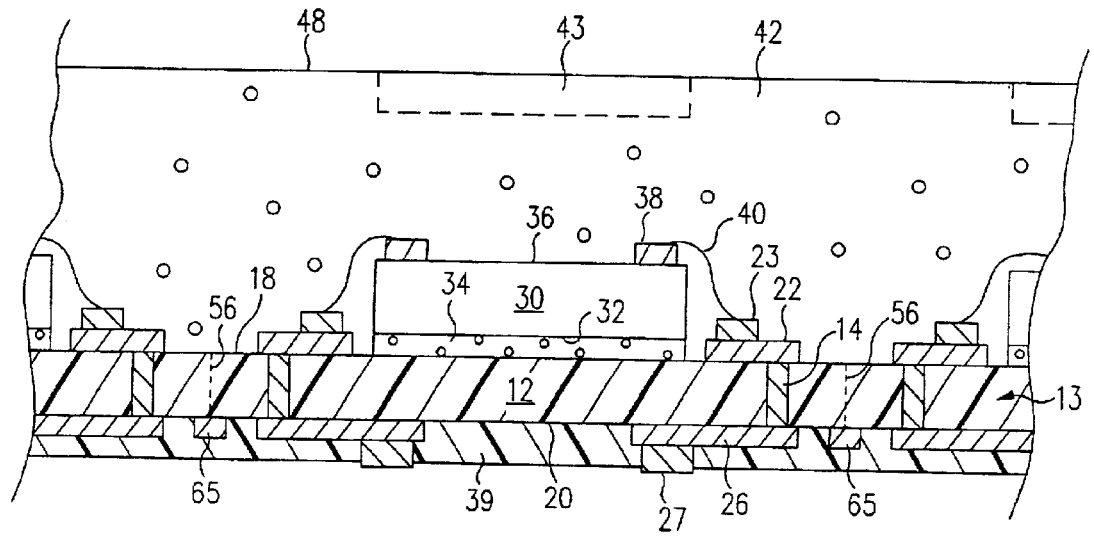
Figure 23:
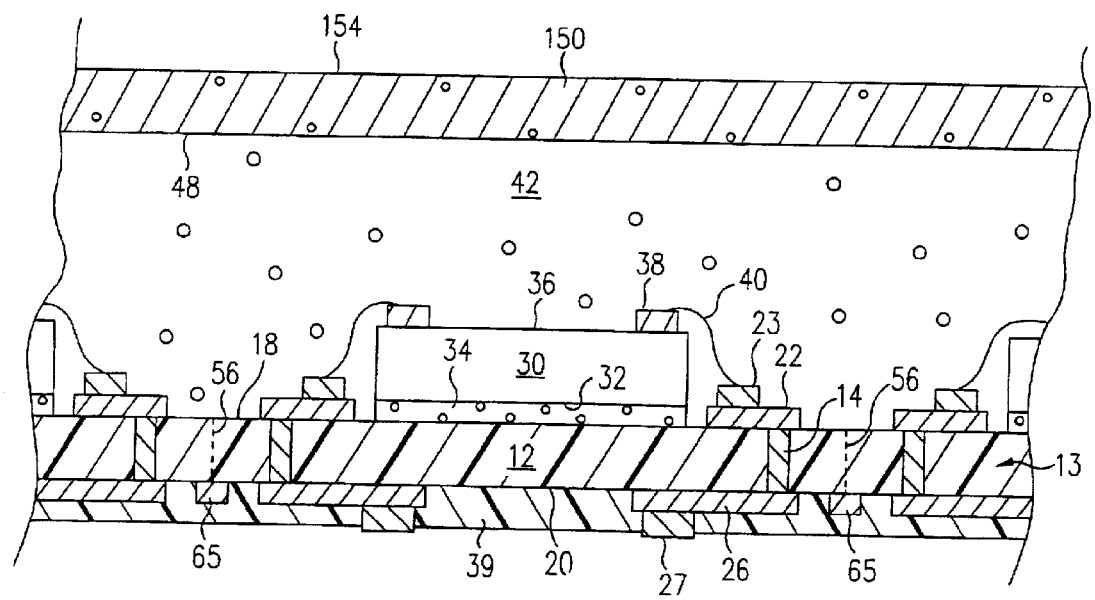

FIG. 22 is a cross-sectional view of shielded package 10B further along in processing. As shown in FIG. 22, a layer of encapsulant 42 is applied over the entire assembly and then cured. In particular, layer of encapsulant 42 covers IC chip 30 including bonding pads 38, bond wires 40, contacts 23, metallizations 22 and the remaining exposed first surface 18 of substrate 13. Layer of encapsulant 42 is formed of an electrically insulating encapsulant and preferably is Dexter Hysol 4450 or 4451 or an equivalent.

As illustrated by the dashed rectangle in FIG. 22, a heat slug 43 such as that set forth in Glenn et al. U.S. Pat. No. 5,596,485, herein incorporated by reference in it entirety, can be embedded into layer of encapsulant 42 to improve the heat transfer from IC chip 30 to the outside environment. Heat slug 43 is typically a copper heat slug and is simply pressed into layer of encapsulant 42 as the encapsulant solidifies. Heat slug 43 is not illustrated in subsequent processing steps or in FIGS. 1–6 although it is understood that a heat slug can be incorporated into the embodiments illustrated by these figures. As a further alternative, an electrically insulating thermally conductive filler such as aluminum nitrate can be added to layer of encapsulant 42 to improve the heat transfer from IC chip 30 to the outside environment.

FIG. 22 is a cross-sectional view of shielded package 10B further along in processing. As shown in FIG. 22, after layer of encapsulant 42 is cured, shield layer 150 is applied over the entire assembly and in particular on upper surface 48 of layer of encapsulant 42. After curing, shield layer 150 can be laser marked for product identification using conventional laser marking techniques.

Referring back to FIGS. 18A and 18B, and in particular to FIG. 18B, layer of encapsulant 42 (FIG. 22) is applied by partially filling the pocket defined by dam 59 with an electrically insulating liquid encapsulant. Shield layer 150 is then applied by filling the remainder of the pocket defined by dam 59 with an electrically conductive liquid encapsulant. Dam 59 prevents layer of encapsulant 42 and shield layer 150 from flowing off of first surface 18 of substrate 13. Preferably, dam 59 has a height indicated by dashed line 68 above first surface 18 greater than or equal to the height of upper surface 154 of shield layer 150 above first surface 18. Of importance, use of dam 59 insures that layer of encapsulant 42 and shield layer 150 have uniform thickness, e.g. no greater than 10% variation in thickness over the entire area of substrate 13.

Referring again to FIG. 22, instead of using an electrically conductive liquid encapsulant to form shield layer 150, shield layer 150 can be an electrically conductive plate or screen material. In this alternative, the plate or screen is pressed into layer of encapsulant 42 before curing so that the upper surface of layer of encapsulant 42 is surface 154 (and item 48 is the lower surface of the plate or screen), i.e. the plate or screen is contained in layer of encapsulant 42 with the possible exception of the upper surface of the plate or screen which may be exposed to the outside environment.

Preferably, the plate or screen has apertures large enough to allow any air trapped below the plate or screen or in layer of encapsulant 42 to escape. See Glenn et al., U.S. Pat. No. 5,596,485, cited above, for a discussion of the use of apertures to avoid air bubble entrapment. As a further alternative, the plate or screen can be only partially pressed into layer of encapsulant 42 such that the plate or screen overlies upper surface 48 of layer of encapsulant 42.

Figure 24A:
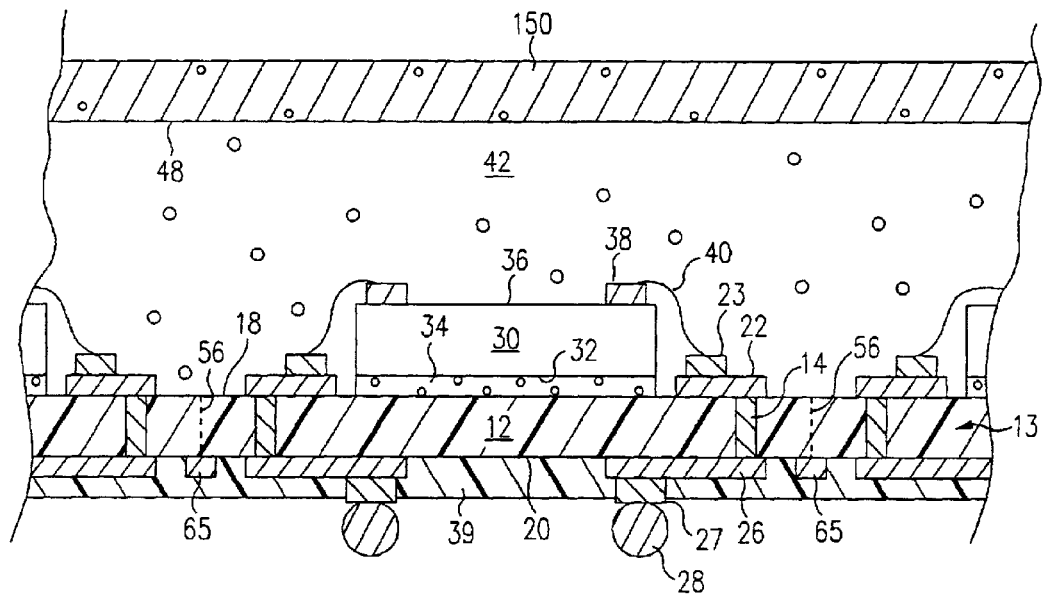
FIGS. 24A and 24B are cross-sectional and bottom plan views, respectively, of the shielded package further along in fabrication in accordance with the present invention.
Figure 24B:
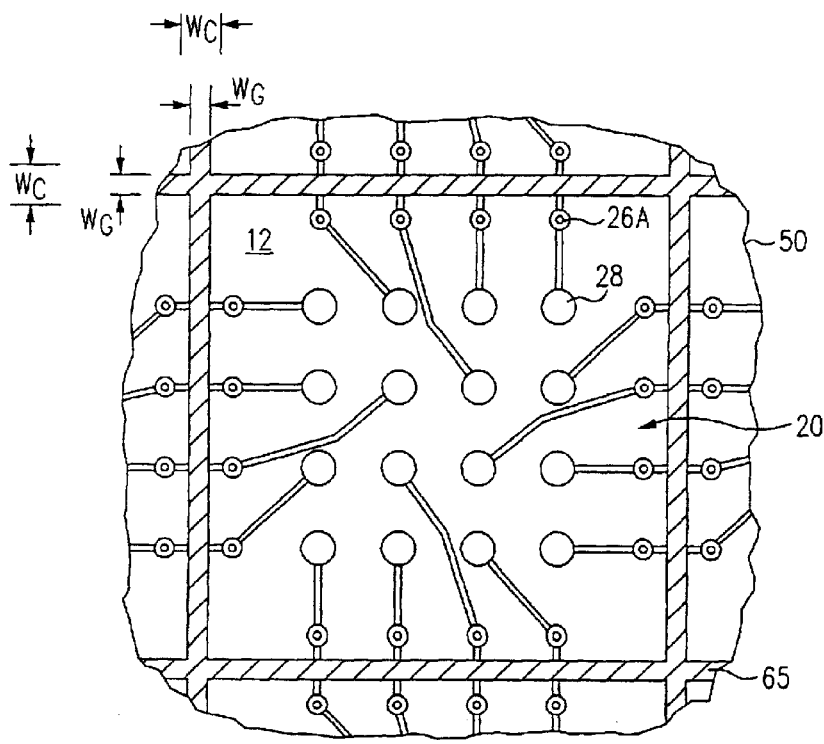

FIGS. 24A and 24B are cross-sectional and bottom plan views, respectively, of shielded package 10B further along in processing. In FIG. 24B, solder mask 39 is not shown for purposes of clarity. As shown in FIG. 24A, interconnection balls 28, typically eutectic solder balls, preferably made of 63% tin and 37% lead, are attached to contacts 27 using conventional techniques.

As shown in FIG. 24B, interconnection balls 28 are arranged in an array thus forming a ball grid array. Although the formation of a package including interconnection balls 28 is described, in alternative embodiments, contacts 27 form interconnection pads for electrical interconnection with other components and interconnection balls 28 are not formed. Further, the interconnection balls or pads can be arranged adjacent the perimeter of section 12, i.e. can be arranged near reference grid 65 (near lines 56 and/or lines 58), instead of being arranged in an array fashion as in FIG. 24B.

In an alternative embodiment, the interconnection balls or the interconnection pads are formed at substrate bonding locations on second surface 20 of substrate 12. As described in reference to FIG. 1, the interconnection balls or interconnection pads formed at the substrate bonding locations are electrically coupled to metallizations 22 by electrically conductive traces and/or vias of substrate 12. Thus, in this alternative embodiment, metallizations 26 may not be present on second surface 20 of substrate 12, for example when the substrate bonding locations are at the end of electrically conductive vias.

Referring again to FIG. 24A, substrate 13, layer of encapsulant 42 and shield layer 150 are then cut, typically by sawing, along lines 56, 58 (best seen in FIG. 18A) to form shielded package 10B (FIG. 14). Typically, solder mask 39 (or second surface 20 of substrate 13) is marked for cutting. A blue wafer mounting tape (available from Nitto for example) conventionally used to hold a wafer while it is cut into individual IC chips can be used to hold the assembly while substrate 13, layer of encapsulant 42 and shield layer 150 are cut to form shielded package 10B as those skilled in the art will understand.

Of importance, the width WC of the cut is greater than the width WG of reference grid 65. Thus, during the process of cutting substrate 13, layer of encapsulant 42 and shield layer 150, reference grid 65 is sawed away leaving each metallization 26 electrically isolated all the other metallizations 26. This, in turn, results in a structure where each interconnection ball 28 is electrically coupled to only a single corresponding bonding pad 38.

Cutting substrate 13 simultaneously with layer of encapsulant 42 and shield layer 150 forms package 10B with edges 43 of layer of encapsulant 42 and edges 152 of shield layer 150 (see FIG. 14) coincident with edges 46 of substrate 12. It is understood that in this embodiment, substrate 12 (FIG. 14) in each shielded package 10B is a section of the larger substrate 13 (FIG. 18A).

After substrate 13, layer of encapsulant 42 and shield layer 150 are cut, yet while the individual packages 10B are still mounted on the blue wafer mounting tape, each shielded package 10B is tested and bad packages are marked. (Substrate 13 is mounted onto the blue wafer mounting tape with shield layer 150 facing down onto the blue wafer mounting tape and interconnection balls 28 facing up.) Testing involves contacting interconnection balls 28 (which are conveniently facing upwards) with test probes or contacts as is known to those skilled in the art. Testing the plurality of packages together while the packages are still mounted on the blue wafer mounting tape is faster and advantageously reduces testing cost as compared to placing each package into a tester individually and then testing the package.

Figure 25:
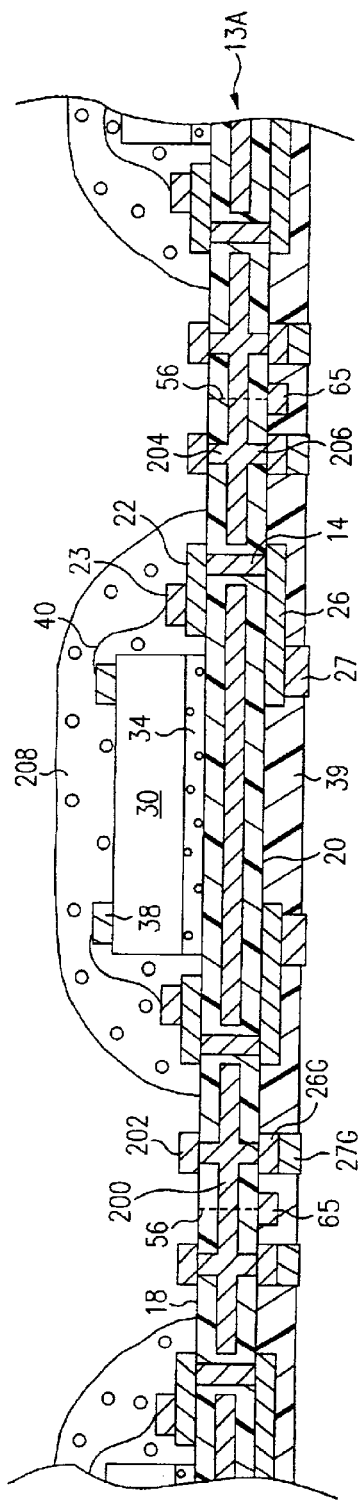
FIGS. 25 and 26 are cross-sectional views of a fully shielded package at various stages during fabrication in accordance with an alternative embodiment of the present invention.
Figure 26:
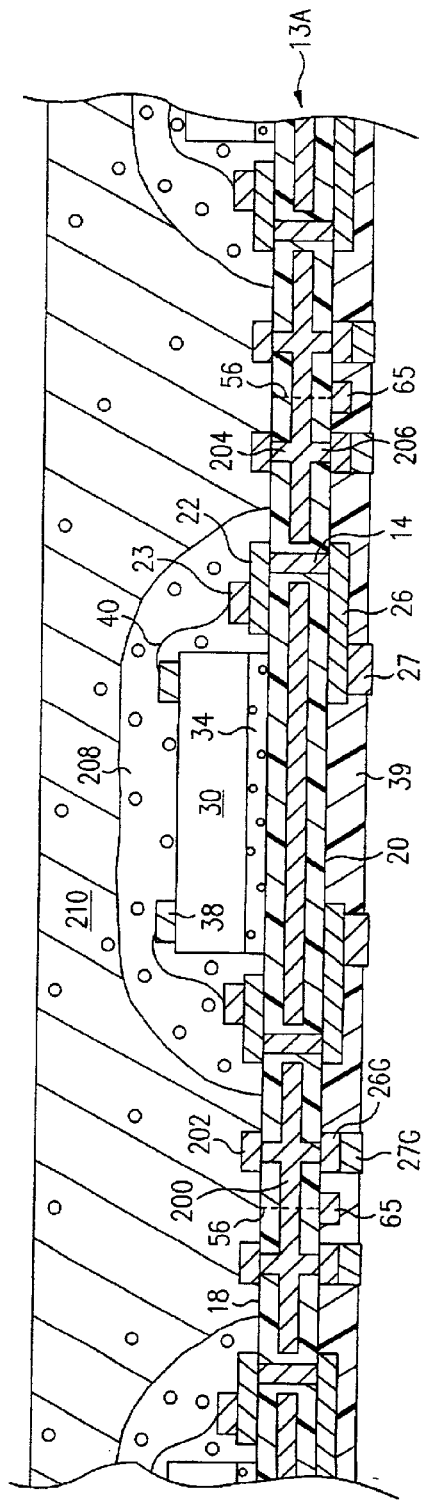

FIGS. 25 and 26 are cross-sectional view of fully shielded package 10D at various stages during fabrication in accordance with an alternative embodiment of the present invention. Referring to FIG. 25, after IC chips 30 are mounted to substrate 13A and wirebonded, encapsulant caps 208 are formed. Illustratively, encapsulant caps 208 are formed by applying a medium viscosity encapsulant using a conventional needle dispenser and then curing the encapsulant. In one embodiment, the medium viscosity encapsulant is Hysol 4323 or 4322 or an equivalent.

The medium viscosity encapsulant has sufficient viscosity to flow around and encapsulate IC chip 30 including bonding pads 38, bond wires 40, metallizations 22 and contacts 23. However, the encapsulant has a high enough viscosity to prevent the encapsulant from significantly flowing away from the point of application. Accordingly, the encapsulant is confined to the region inward of ground contacts 202.

Referring now to FIG. 26, after encapsulant caps 208 are applied and cured, an electrically conductive liquid encapsulant is applied and cured to form shield layer 210. Shield layer 210 is formed in a manner similar to the formation of layer of encapsulant 42 and shielded layer 150 described in relation to FIGS. 11 and 12, i.e. by filling a pocket defined by dam 59 with an encapsulant (except for a single electrically conductive liquid encapsulant is used). Shield layer 210 encapsulates encapsulant caps 208, the portion of first surface 18 of substrate 13A uncovered by encapsulant caps 208, and grounding contacts 202. In one embodiment, ground plane 200 and thus shield layer 210 are electrically connected to ground, e.g., through electrical interconnections with reference grid 65 and/or interconnection balls 28G. Processing then continues as described in relation to FIGS. 19–24 to form fully shielded package 10D (FIG. 16).

Of importance, a plurality of fully shielded packages 10D are formed using only a three step encapsulation process, i.e. (1) forming a single dam 59; (2) forming encapsulant caps 208; and (3) forming shield layer 210. In contrast, Lin requires a four step encapsulation process for each package, i.e. (1) forming dam structure 40; (2) applying first encapsulant 38; (3) forming dam structure 44; and (4) applying second encapsulant 42. Accordingly, formation of fully shielded packages 10D in accordance with the present invention is relatively simple, is less labor intensive and, consequently, is substantially less expensive than Lin.

Although the present invention has been described with reference to preferred embodiments, persons skilled in the art will recognize that changes may be made in form and detail without departing from the spirit and scope of the invention. For example, referring to FIG. 1, contacts 23 and/or contacts 27 are optional and do not have to be formed. Further, a solder mask layer can be formed over selective portions of first surface 18 of substrate 12. Also, solder mask layer 39 on second surface 20 of substrate 12 does not have to be formed. Further, referring to FIG. 18B, instead of using dam 59 and liquid encapsulants, conventional transfer molding processes can be used to encapsulate the assembly. Thus, the invention is limited only by the following claims.

We claim:

1. A method of forming a plurality of integrated circuit chip packages, said method comprising:

providing a substrate having a plurality of sections, each of said sections having first metallizations formed on a first surface of said substrate;

coupling an integrated circuit chip to a corresponding one of each of said sections of said substrate;

electrically connecting each said integrated circuit chip to said first metallizations on said corresponding one of said sections;

encapsulating said integrated circuit chips, said first metallizations and said first surface of said substrate with a layer of an encapsulant, wherein said layer of the encapsulant has an outer surface overlying the integrated circuit chips;

placing the outer surface of the layer of the encapsulant on a mounting surface, and immobilizing the encapsulated substrate on said mounting surface;

cutting said encapsulated substrate while on said mounting surface along a periphery of each of said sections to form said plurality of integrated circuit chip packages.

2. The method of claim 1, wherein said mounting surface is a tape with an adhesive layer thereon, wherein the adhesive layer immobilizes the encapsulated substrate, and the layer of the encapsulant comprises a first layer of an electrically insulative encapsulant, and a second layer of an electrically conductive encapsulant at said outer surface.

3. The method of claim 1, further comprising electrically testing said packages while said packages are immobilized on said mounting surface.

4. The method of claim 1, wherein each of said sections has second metallizations formed on a second surface of said substrate opposite said first surface and electrically conductive paths extending through said substrate from said first metallizations to said second metallizations.

5. The method of claim 4, further comprising forming interconnection balls on said second surface of said substrate at each of said sections, each of said interconnection balls being in electrical connection with one of said second metallizations.

6. The method of claim 1, wherein the layer of the encapsulant comprises a first layer of an electrically insulative encapsulant, and a second layer of an electrically conductive encapsulant at said outer surface.

7. The method of claim 1, wherein said mounting surface is a tape with an adhesive layer thereon, wherein the adhesive layer contacts the outer surface of the layer of encapsulant and thereby immobilizes the encapsulated substrate.

8. A method of forming a plurality of integrated circuit chip packages, said method comprising the steps of:

providing a substrate having a first surface and a plurality of sections, each said section having an integrated circuit chip coupled to the first surface of the substrate within the respective section, wherein a layer of an encapsulant covers the first surface of the substrate and the integrated circuit chips, said layer of the encapsulant having an outer surface overlying the integrated circuit chips;

placing the outer surface of the layer of the encapsulant on a mounting surface, and immobilizing the encapsulated substrate thereon;

cutting said encapsulated substrate along a periphery of each of said sections to form said plurality of integrated circuit chip packages.

9. The method of claim 8, wherein said mounting surface is a tape with an adhesive layer thereon, wherein the adhesive layer immobilizes the encapsulated substrate, and the layer of the encapsulant comprises a first layer of an electrically insulative encapsulant, and a second layer of an electrically conductive encapsulant at said outer surface.

10. The method of claim 8, further comprising electrically testing said packages while said packages are immobilized on said mounting surface.

11. The method of claim 10, further comprising forming interconnection balls on a second surface of said substrate at each of said sections, said interconnection balls being electrically coupled to the integrated circuit chip of the respective section.

12. The method of claim 8, wherein the layer of the encapsulant comprises a first layer of an electrically insulative encapsulant, and a second layer of an electrically conductive encapsulant at said outer surface.

13. The method of claim 8, wherein said mounting surface is a tape with an adhesive layer thereon, wherein the adhesive layer contacts the outer surface of the layer of encapsulant and thereby immobilizes the encapsulated substrate.

14. A method of forming a plurality of integrated circuit chip packages, said method comprising the steps of:

providing a substrate having a plurality of sections, each said section having an integrated circuit chip coupled to a first surface of the substrate within the section, wherein a layer of an encapsulant covers the first surface of the substrate and the integrated circuit chips, said layer of the encapsulant having an outer surface overlying the integrated circuit chips;

placing the outer surface of the layer of the encapsulant on a mounting surface, and immobilizing the encapsulated substrate thereon; and cutting said encapsulated substrate from the substrate through the layer of the encapsulant along a periphery of each of said sections while immobilized on said mounting surface to form said plurality of integrated circuit chip packages.

15. The method of claim 14, wherein said mounting surface is a tape with an adhesive layer thereon, wherein the adhesive layer immobilizes the encapsulated substrate, and the layer of the encapsulant comprises a first layer of an electrically insulative encapsulant, and a second layer of an electrically conductive encapsulant at said outer surface.

16. The method of claim 15, further comprising electrically testing said packages while said packages are immobilized on said mounting surface.

17. The method of claim 16, further comprising forming interconnection balls on a second surface of said substrate at each of said sections, each of said interconnection balls being in electrical connection with the integrated circuit chip of the respective section.

18. The method of claim 14, wherein the layer of the encapsulant comprises a first layer of an electrically insulative encapsulant, and a second layer of an electrically conductive encapsulant at said outer surface.

19. The method of claim 14, wherein said mounting surface is a tape with an adhesive layer thereon, wherein the adhesive layer contacts the outer surface of the layer of encapsulant and thereby immobilizes the encapsulated substrate.

* * * * *

UNITED STATES PATENT AND TRADEMARK OFFICE
CERTIFICATE OF CORRECTION

PATENT NO. : 6,962,829 B2
DATED : November 8, 2005
INVENTOR(S) : Thomas P. Glenn, Roy D. Hollaway and Anthony E. Panczak It is certified that error appears in the above-identified patent and that said Letters Patent is hereby corrected as shown below:

Column 20,
Line 1, insert -- immobilized -- between "said" and "encapsulated".

Signed and Sealed this

Seventh Day of March, 2006

JON W. DUDAS
*Director of the United States Patent and Trademark Office*